US011740911B2

(12) United States Patent
Grohoski et al.

(10) Patent No.: US 11,740,911 B2
(45) Date of Patent: Aug. 29, 2023

(54) SWITCH FOR ROUTING DATA IN AN ARRAY OF FUNCTIONAL CONFIGURABLE UNITS

(71) Applicant: SambaNova Systems, Inc., Palo Alto, CA (US)

(72) Inventors: Gregory F. Grohoski, Bee Cave, TX (US); Manish K. Shah, Austin, TX (US); Kin Hing Leung, Cupertino, CA (US)

(73) Assignee: SambaNova Systems, Inc., Palo Alto, CA (US)

( * ) Notice: Subject to any disclaimer, the term of this patent is extended or adjusted under 35 U.S.C. 154(b) by 0 days.

(21) Appl. No.: 17/738,867

(22) Filed: May 6, 2022

(65) Prior Publication Data

US 2023/0016892 A1 Jan. 19, 2023

Related U.S. Application Data

(63) Continuation of application No. 17/378,391, filed on Jul. 16, 2021, now Pat. No. 11,327,771.

(51) Int. Cl.
*G06F 13/20* (2006.01)
*G06F 9/4401* (2018.01)
(Continued)

(52) U.S. Cl.
CPC ............ *G06F 9/4403* (2013.01); *G06F 13/20* (2013.01); *G06F 13/4022* (2013.01);
(Continued)

(58) Field of Classification Search
CPC .... G06F 9/4403; G06F 13/20; G06F 13/4022; G06F 15/17343; G06F 15/7867; G06F 15/80
See application file for complete search history.

(56) References Cited

U.S. PATENT DOCUMENTS

| 5,498,975 A | 3/1996 | Cliff et al. |
| 6,119,181 A | 9/2000 | Vorbach et al. |

(Continued)

FOREIGN PATENT DOCUMENTS

| CN | 101485576 A | 7/2009 |
| CN | 101593169 A | 12/2009 |

(Continued)

OTHER PUBLICATIONS

Wang et al., "An Overview of Micron's Automata Processor," Proc. of the 11th IEEE/ACM/IFIP Int'l Conf. on Hardware/Software Codesign and System Synthesis, No. 14, Oct. 1, 2016, 3 pages.
(Continued)

*Primary Examiner* — Cheng Yuan Tseng
(74) *Attorney, Agent, or Firm* — Flagship Patents; Sikander Khan; Bruce Young

(57) ABSTRACT

A system includes a multidimensional array of homogenous Functional Configurable Units (FCUs), coupled using a multidimensional array of switches, and a parameter store on the device which stores parameters that tag a subarray of FCUs as unusable. Technologies are described which change the pattern of placement of configuration data, in dependence on the tagged subarray, by changing the routing through the array of switches. As a result, a multidimensional array of FCUs having unusable elements can still be used.

20 Claims, 23 Drawing Sheets

(51) Int. Cl.
  *G06F 13/40* (2006.01)
  *G06F 15/173* (2006.01)
  *G06F 15/78* (2006.01)
  *G06F 15/80* (2006.01)

(52) U.S. Cl.
  CPC .... *G06F 15/17343* (2013.01); *G06F 15/7867* (2013.01); *G06F 15/80* (2013.01)

(56) References Cited

U.S. PATENT DOCUMENTS

| | | |
|---|---|---|
| 6,728,862 B1 | 4/2004 | Wilson |
| 6,766,505 B1 | 7/2004 | Rangan et al. |
| 7,010,667 B2 * | 3/2006 | Vorbach ........... H03K 19/17796 703/23 |
| 7,111,213 B1 | 9/2006 | Dastidar et al. |
| 7,216,227 B2 | 5/2007 | Grynberg |
| 7,228,521 B1 | 6/2007 | Ma et al. |
| 7,251,804 B1 | 7/2007 | Trimberger |
| 7,299,339 B2 | 11/2007 | Ramesh |
| 7,685,254 B2 | 3/2010 | Pandya |
| 7,795,901 B1 | 9/2010 | Yang et al. |
| 7,902,855 B1 | 3/2011 | Lewis |
| 7,904,848 B2 | 3/2011 | Coene et al. |
| 7,906,984 B1 | 3/2011 | Montminy et al. |
| 7,952,387 B1 | 5/2011 | Frazer |
| 8,645,955 B2 | 2/2014 | Yim et al. |
| 8,860,460 B1 | 10/2014 | Cashman |
| 8,990,740 B2 | 3/2015 | Zhang et al. |
| 9,129,043 B2 | 9/2015 | Pandya |
| 9,160,617 B2 * | 10/2015 | Alvarez-Icaza Rivera ................. H04L 49/1523 |
| 9,178,513 B1 | 11/2015 | Hutton et al. |
| 9,372,956 B1 | 6/2016 | Fan et al. |
| 9,411,532 B2 | 8/2016 | Vorbach et al. |
| 9,448,967 B2 | 9/2016 | Kuechler |
| 9,465,632 B2 | 10/2016 | Ebcioglu et al. |
| 9,495,154 B2 | 11/2016 | Khan |
| 9,690,747 B2 | 6/2017 | Vorbach et al. |
| 9,697,318 B2 | 7/2017 | Hutton et al. |
| 9,698,794 B1 | 7/2017 | Fender et al. |
| 9,992,057 B2 | 6/2018 | Alvarez-Icaza Rivera et al. |
| 10,445,098 B2 | 10/2019 | Fleming et al. |
| 10,642,630 B1 | 5/2020 | Shaddock et al. |
| 10,698,853 B1 | 6/2020 | Grohoski et al. |
| 10,713,403 B1 | 7/2020 | Agrawal et al. |
| 10,831,507 B2 | 11/2020 | Shah et al. |
| 11,049,586 B2 | 6/2021 | Parikh et al. |
| 2001/0047509 A1 | 11/2001 | Mason et al. |
| 2002/0004916 A1 | 1/2002 | Marchand et al. |
| 2004/0153608 A1 | 8/2004 | Vorbach et al. |
| 2006/0010306 A1 | 1/2006 | Saito et al. |
| 2010/0161309 A1 | 6/2010 | Chartraire et al. |
| 2010/0268862 A1 | 10/2010 | Park et al. |
| 2010/0333058 A1 | 12/2010 | Goodnow et al. |
| 2012/0126850 A1 | 5/2012 | Wasson et al. |
| 2013/0024621 A1 | 1/2013 | Choi et al. |
| 2013/0227255 A1 | 8/2013 | Kim |
| 2013/0326190 A1 | 12/2013 | Chung et al. |
| 2014/0092728 A1 | 4/2014 | Alvarez-Icaza Rivera et al. |
| 2014/0237227 A1 | 8/2014 | Aizawa |
| 2014/0331031 A1 | 11/2014 | Suh et al. |
| 2016/0246602 A1 | 8/2016 | Radhika et al. |
| 2018/0024841 A1 | 1/2018 | Hiscock |
| 2018/0089117 A1 | 3/2018 | Nicol |
| 2018/0189231 A1 | 7/2018 | Fleming, Jr. et al. |
| 2018/0275193 A1 | 9/2018 | Rouge et al. |
| 2019/0087201 A1 | 3/2019 | Hiscock |
| 2020/0159692 A1 | 5/2020 | Shah et al. |
| 2021/0064975 A1 | 3/2021 | Purandare et al. |
| 2022/0027071 A1 | 1/2022 | Zhu et al. |

FOREIGN PATENT DOCUMENTS

| | | |
|---|---|---|
| CN | 108090022 A | 5/2018 |
| TW | 201346758 A | 11/2013 |
| TW | 201610708 A | 3/2016 |
| WO | 2010142987 A1 | 12/2010 |

OTHER PUBLICATIONS

U.S. Office Action in U.S. Appl. No. 17/378,391 dated Nov. 18, 2021, 7 pages.
U.S. Appl. No. 17/093,543 Office Action dated Oct. 12, 2021, 20 pages.
Hatori et al., "Introducing redundancy in field programmable gate arrays," Proceedings of IEEE Custom Integrated Circuits Conference—CICC '93, May 9-12, 1993, pp. 7.1.1-7.1.4.
Kuo, et al., "Efficient Spare Allocation for Reconfigurable Arrays," in IEEE Design & Test of Computers, vol. 4, No. 1, pp. 24-31, Feb. 1987.
Zhang et al., "Fault Tolerance Mechanism in Chip Many-Core Processors," Tsinghua Science and Technology, vol. 12, No. S1, Jul. 2007, pp. 169-174.
Trimberger, "Defect avoidance in programmable devices," IET Computers & Digital Techniques, vol. 9, iss. 4, Aug. 14, 2015, pp. 188-189.
Rubin, et al., "Choose-your-own-adventure routing: Lightweight load-time defect avoidance," ACM Transactions on Reconfigurable Technology and Systems, vol. 4, No. 4, Article 33, Dec. 4, 2011, pp. 1-24.
U.S. Appl. No. 17/378,391—Response to Office Action dated Nov. 18, 2021, filed Feb. 17, 2022, 10 pages.
U.S. Office Action in U.S. Appl. No. 17/378,342 dated Oct. 26, 2021, 18 pages.
U.S. Office Action in U.S. Appl. No. 17/378,399 dated Dec. 9, 2021, 10 pages.
U.S. Appl. No. 17/378,342—Response to Office Action dated Oct. 26, 2021, filed Dec. 15, 2021, 15 pages.
U.S. Appl. No. 17/378,342—Final Office Action, dated Jan. 12, 2022, 30 pages.
U.S. Appl. No. 17/378,342—Response to Final Office Action dated Jan. 12, 2022, filed Mar. 4, 2022, 15 pages.
U.S. Appl. No. 17/378,399—Response to Office Action dated Dec. 9, 2021, filed Mar. 1, 2022, 9 pages.
AMBA AXI and ACE Protocol Specification, ARM, as early as Jan. 2003, 440 pages.
PCT/US2019/062287—International Search Report and Written Opinion dated Feb. 5, 2020, 18 pages.
U.S. Appl. No. 16/197,826—Notice of Allowance dated May 18, 2020, 22 pages.
PCT/US2019/062289—International Search Report and Written Opinion dated Feb. 28, 2020, 14 pages.
U.S. Appl. No. 16/197,826—Notice of Allowance dated Jun. 29, 2020, 11 pages.
PCT/US2019/062287—Response to Chapter II, dated Sep. 1, 2020, 17pgs.
PCT/US2019/062289—Response to Chapter II Demand, dated Sep. 15, 2020, 11 pages.
U.S. Appl. No. 16/198,086—Notice of Allowance dated Jan. 15, 2021, 23 pages.
U.S. Appl. No. 16/198,086—Notice of Allowance (after RCE) dated Jun. 28, 2021, 9 pages.
PCT/US2019/062287 International Preliminary Report on Patentability, dated Feb. 19, 2021, 31 pages.
PCT/US2019/062289—International Preliminary Report on Patentability dated Feb. 19, 2021, 27 pages.
CA 3120683—First Office Action dated Sep. 1, 2021, 3 pages.
TW 108142191—First Office Action dated, Nov. 3, 2021, 17 pages.
CA 3120683 Voluntary Amendments, dated Aug. 4, 2021, 9 pages.
EP 198213613 Rules 161(1) and 162 Communication, dated Jul. 1, 2021, 3 pages.
TW 108142191—Response to First Office Action dated Nov. 3, 2021, filed Jan. 26, 2022, 9 pages.

(56) References Cited

OTHER PUBLICATIONS

TW 108142191—Notice of Allowance, dated Feb. 21, 2022, 2 pages.
U.S. Appl. No. 17/093,543—Response to Office Action dated Oct. 12, 2021, filed Jan. 20, 2022, 4 pages.
CA 3120683—Response to First Office Action dated Sep. 1, 2021, filed Dec. 31, 2021, 4 pages.
EP 198213613—Response to Rules 161(1) and 162 Communication dated Jul. 1, 2021, filed Jan. 11, 2022, 12 pages.
EP 19829712.9—Rules 161(1) and 162 Communication, dated Jun. 30, 2021, 3 pages.
EP 19829712.9—Response to Rules 161(1) and 162 Communication dated Jun. 30, 2021, filed Jan. 10, 2022, 11 pages.
Podobas et al., A Survey on Coarse-Grained Reconfigurable Architectures From a Performance Perspective, IEEEAccess, vol. 2020. 3012084, Jul. 27, 2020, 25 pages.
M. Emani et al., "Accelerating Scientific Applications With SambaNova Reconfigurable Dataflow Architecture," in Computing in Science & Engineering, vol. 23, No. 2, pp. 114-119, Mar. 1-Apr. 2021, doi: 10.1109/MCSE.2021.3057203.
Yabhakar et al., "Plasticine: A Reconfigurable Architecture for Parallel Patterns", ISCA '17, Jun. 24-28, 2017, Toronto, ON, Canada.
U.S. Appl. No. 17/378,391 Notice of Allowance, dated Mar. 9, 2022, 9 pages.
U.S. Appl. No. 17/378,399 Notice of Allowance dated Mar. 16, 2022, 7 pages.
U.S. Appl. No. 17/378,391—Corrected Notice of Allowance, dated Mar. 25, 2022, 14 pages.
U.S. Appl. No. 17/378,399—Notice of Allowance, dated Apr. 5, 2022, 11 pages.
CA-3120683 Office Action, dated Sep. 1, 2021, 3 pages.
CA 3120683—Notice of Allowance dated Feb. 17, 2022, 1 page.
CN 201980089713—First Office Action, dated Feb. 16, 2022, 6 pages.
U.S. Appl. No. 17/093,543—Office Action dated Apr. 19, 2022, 32 pages.
CN 201980089713—Notice of Allowance dated Jul. 20, 2022, 3 pages.
CN 201980089713—Response to First Office Action, dated Jun. 29, 2022, 17 pages.
Prabhakar et. al., "Plasticine: A Reconfigurable Architecture for Parallel Patterns", ISCA '17, Jun. 24-28, 2017, Toronto, ON, Canada.
U.S. Appl. No. 17/378,342 Notice of Allowance dated Aug. 15, 2022, 23 pages.

\* cited by examiner

SWITCH FOR ROUTING DATA IN AN ARRAY OF FUNCTIONAL CONFIGURABLE UNITS

CROSS-REFERENCE TO RELATED APPLICATIONS

This application is a continuation of U.S. patent application Ser. No. 17/378,391, now U.S. Ser. No. 11/327,771, entitled "DEFECT REPAIR CIRCUITS FOR A RECONFIGURABLE DATA PROCESSOR," filed Jul. 16, 2021 which is incorporated by reference for all purposes.

BACKGROUND

Technological Field

The present technology relates to technologies for yield improvement for reconfigurable architectures, which can be particularly applied to coarse-grain reconfigurable architectures and other spatially reconfigurable architectures using redundancy.

Description of Related Art

Reconfigurable processors, including field programmable gate arrays (FPGAs), can be configured to implement a variety of functions more efficiently or faster than might be achieved using a general-purpose processor executing a computer program. So-called coarse-grain reconfigurable architectures (e.g. CGRAs) are being developed in which the configurable units in the array are more complex than used in typical, more fine-grained FPGAs, and may enable faster or more efficient execution of various classes of functions. For example, CGRAs have been proposed that can enable implementation of energy-efficient accelerators for machine learning and artificial intelligence workloads. See, Prabhakar, et al., "Plasticine: A Reconfigurable Architecture for Parallel Patterns," ISCA '17, Jun. 24-28, 2017, Toronto, ON, Canada.

Configuration of reconfigurable processors involves compilation of a configuration description to produce an application graph represented by a configuration file, referred to sometimes as a bitstream or bit file. To start a process implemented using an application graph, the configuration file must be loaded for that process. To change a process implemented using an application graph, the configuration file must be replaced with a new configuration file. In spatially reconfigurable devices, such as a CGRA, the configuration includes defining operations of the graph using unit configuration files that set the operation of individual configurable units, spatially distributing the unit configuration files by placing them at configurable units within the array and routing the communications by configuring the interconnections among the configurable units to accomplish the graph, in a procedure that is sometimes referred to as "place and route."

In manufacturing of complex integrated circuits, it is difficult to avoid some manufacturing defects which can render parts of the integrated circuits unusable. So, redundant circuit elements have been deployed in some types of devices, such as high-density memory. In memory devices, redundant memory cells can be deployed outside the main array, along with supporting circuits to reroute access to defective cells to the redundant cells. This technique increases yield of the manufacturing process because defects that can be repaired do not render the devices unusable.

It is desirable to provide technologies to repair unusable elements in reconfigurable processors, and to improve the manufacturing yield of reconfigurable processors.

SUMMARY

Technologies are described which enable repair of manufacturing defects, or repair of otherwise unusable elements, in a Coarse-Grained Reconfigurable Array processor, and in other types of reconfigurable processor arrays. A technology is described which enables repair of manufacturing defects, or repair of otherwise unusable elements, in integrated circuits having data flow architectures or hybrid data flow and control flow architectures.

A device architecture is described that includes a spatially reconfigurable array of processors, such as configurable units of a CGRA, having spare elements, and a parameter store on the device which stores parameters that tag one or more elements of the array as unusable. For example, a default spatial arrangement of the array can include a set number of rows and columns of processors, and spare elements of the array can be located outside the set number of rows and columns, such as in an extra row or an extra column.

Technologies are described which establish a pattern of placement in dependence on the tagged row, such as by changing the pattern of placement of configuration data specified by an initial configuration file for a default spatial arrangement of configurable units in the array, in dependence on the tagged elements. A configuration file can include a data set composed of unit configuration files which define respective configurations of individual configurable units in the array to configure an execution graph needed to execute a data processing operation. Also, a configuration file includes placement of the data set, mapping the unit configuration files to individual configurable units in the array which implement a pattern of placement. Establishing the pattern of placement in dependence on the tagged element or elements, can include moving a unit configuration file placed at the unusable element in the default spatial arrangement to a usable configurable unit. The useable configurable element is preferably spatially adjacent to the unusable element. Placement of unit configuration files in the remainder of the array is shifted in a manner that accommodates the move, tends to preserve adjacency for the purposes of routing, and can place one or more unit configuration files allocated to other configurable units in spare elements. The placement established in dependence on the tagged element can result in a pattern which replaces the unusable elements with elements that are not identified as unusable in a manner that incorporates one or more spare elements in the data flow of the data processing operation.

In one embodiment, a virtual addressing approach is implemented. The configuration file can define a placement of unit configuration files using virtual addresses. The configurable units have physical addresses identifying physical locations on the reconfigurable array. The default spatial arrangement mentioned above is the case in which the virtual addresses equal the physical addresses of the configurable units. Circuits on or connected to the configurable array convert the virtual addresses used in the configuration file to physical addresses in dependence on the tagged element or elements, and load the configuration file to establish a pattern of placement as discussed above.

Also, a configuration file can include unit configuration files for interconnect configurable units, such as switches, which implement routing of communications among the functional configurable units in the array. A technology is described which can change the routing specified by the configuration file, to adjust to the change in placement of unit configuration files among the functional configurable units, and to avoid the tagged elements. In some embodiments, this technology includes configuration logic circuits on the same integrated circuit substrate as the configurable array.

In a system described herein, the configurable interconnect coupled with the array of configurable units comprises a bus system with a plurality of configurable switches, which includes routing logic to route data communications among the configurable units in the array according to one or more communication protocols, configured by switch configuration data in the configuration file for a data processing operation. Technologies are described which change the routing logic in the configurable switches in dependence on the tagged element to accommodate the changed placement of unit configuration files in the array. Technologies are described by which the routing logic operates in dependence on the tagged unusable elements of the array using virtual addressing to direct packets addressed to functional configurable units in a physical location in the array, according to the shifted placement of unit configuration files, rather than according to the physical location of the functional configurable unit.

A system is described comprising a spatially reconfigurable array of processors where the array of processors includes a set of homogeneous sub-arrays of processors. In examples described herein, the processors are functional configurable units, and the homogeneous sub-arrays are rows of functional configurable units, which are homogeneous because they have the same number and types of functional configurable units. In one example, the sub-array of functional configurable units includes more than one type of functional configurable unit. A parameter store stores data indicating a tagged homogeneous sub-array of the set of homogeneous sub-arrays, which can be a homogeneous sub-array that includes at least one unusable element. A configuration controller having access to the array includes resources to execute a procedure to load configuration data to the spatially reconfigurable array of processors in dependence on the tagged homogeneous sub-array, to implement a data processing operation using a subset of the set of homogeneous sub-arrays excluding the tagged homogeneous sub-array.

In an arrangement described herein, the set of homogeneous sub-arrays includes N+1 homogeneous sub-arrays spatially arranged in order SA(i), where i goes from 0 to N. The configuration file includes a corresponding set of configuration sub-array data blocks CSA(i), where i goes between 0 to K−1, where K is equal to or less than N. For there to be at least one spare homogeneous sub-array, K must be less than N. The configuration sub-array data blocks include unit configuration files for configurable units in respective homogeneous sub-arrays. A set of configuration sub-array data blocks corresponds to a set of sub-arrays when CSA(i) is placed in SA(i) in case there is no tagged sub-array. Thus, in the case in which no sub-array is tagged, the configuration sub-array data block CSA(i) is placed in sub-array SA(i) in order. In a case wherein the tagged homogeneous sub-array is sub-array SA(X), where X is a number between 0 and N in the order SA(i), when X is greater than i, the configuration sub-array data blocks CSA(i), are placed in sub-arrays SA(i); and when X is less than or equal to i, the sub-array configuration data block CSA(i) is placed in sub-array SA(i+1).

Thus, where the homogeneous sub-arrays are rows, the placement of configuration data provides for rows on one side of the tagged row (X is greater than i) to be loaded with placements of configuration data blocks unchanged from the initial configuration data, the tagged row X is skipped, provides for the configuration data block placed in row X according to the initial configuration data to be shifted to the next row (row X+1), and provides for the configuration data blocks for the rest of the rows (X is less than i) according to the initial configuration data to be shifted by one row. As a result, the last row according to the placement if utilized in the initial configuration file is shifted to the spare row N (sub-array SA(N)).

A system is described including a runtime processor and memory accessible to the runtime processor executable to provide the configuration data to the configuration controller of a spatially reconfigurable array of processors. In one technology, the system includes memory storing a pre-compiled initial configuration file, and executes a procedure ("just-in-time compiler") which modifies the pre-compiled configuration file in dependence on the tagged homogeneous sub-array to provide the placements updated in dependence on the tagged element. Also, in some embodiments, the runtime processor executes a procedure which modifies the routing information in the pre-compiled initial configuration file in dependence on the tagged element.

In another technology, the memory stores a plurality of pre-compiled configuration files, each including a placement to be used in case a particular tagged sub-array of the array is unusable, and the runtime processor executes a procedure to select, in dependence on the tagged sub-array, one of the pre-compiled configuration files as the configuration file. The pre-compiled configuration files can have placements compiled for respective tagged homogeneous sub-arrays.

In another technology, the memory stores a pre-compiled configuration file which includes a routing data set. The routing data set can include pre-compiled routing configuration data sets, each including routing information to be used in case a particular tagged sub-array of the array is unusable. The routing information can include unit configuration files for the interconnect configurable units, such as switches, in the array. The runtime processor executes a procedure to select, in dependence on the tagged homogeneous sub-array, one of the pre-compiled routing configuration data sets to be loaded with the configuration file.

In some embodiments, the placements are updated, or both placements and routing information are updated, using circuits coupled to the array, such as a configuration controller having an interface for communications with the bus system linking the interconnect configurable units in the array of configurable processors. Such circuits can implement changes in routing and placement, in dependence on the tagged element of the array, without support of procedures, such as just-in-time compilation or configuration file selection, executed by a host processor, or alternatively in coordination with such procedures.

In some embodiments, the functional configurable units in the array include circuits responsive to repair control signals to adjust operations in dependence on the tagged elements. In some embodiments, the interconnect configurable units in the array include circuits responsive to repair control signals to adjust operations, including adjusting routing information, in dependence on the tagged elements. In some embodiments, repair control signals are generated by a configuration controller and transmitted to the configurable units in the array. The repair control signals can be transmitted directly to the configurable units in the array on direct links or point-to-point connections.

A technology is described in which a statically configurable bus system is connected to the processors in the set of homogeneous sub-arrays of processors. In this technology, the configuration controller loads bus configuration data (examples of which include unit configuration files for the interconnect configurable units) to configure the statically configurable bus system. The configuration controller can apply repair control signals indicating relative positions of switches in the bus system to the tagged configurable units or row of configurable units. The repair control signals can be used in the routing logic of the switches to implement a virtual addressing, directing packets addressed to a physical row according to the shifted placement of unit configuration files, rather than according to the physical location of the functional configurable units.

A technology is described comprising an array of processors, where the processors in the array have array locations (e.g., row and column numbers), and are configurable to implement a data processing operation. The system includes a bus system connected to the processors in the array, and configurable logic to route packets of data among the processors in the array. A parameter store is included storing data indicating a tagged subset of the array of processors, the tagged subset having at least one member. A configuration controller has access to the array, and resources to execute a procedure to load bus configuration data to the configurable logic of the bus system to define routes using the array locations for packets of data among the processors in the array, excluding the tagged subset, during the data processing operation.

A technology is described, wherein the bus system includes an array of switches interleaved with the array of processors. The switches include input ports and output ports connecting to other switches in the array of switches, and input ports and output ports connecting to processors in the array of processors. Routing logic in the switches is responsive to the tagged subset, to forward a data packet having a destination processor received on an input port on the switch to an output port on the switch. In one technology, a configuration controller has access to initial processor configuration data in the array with spatially configured processor unit configuration data in dependence on array locations of the processors in the array, and executes a procedure to load processor unit configurations of processors from the configuration file in dependence on the array locations of the processors or processor in the tagged subset. The routing logic in the switches can include logic for a packet carrying an identifier of a processor in the tagged subset, to select an output port of the switch to direct the packet toward a different processor in the array.

In a technology described herein, the packets carry a route identifier, and the routing logic includes a flow table mapping packets having route identifiers to output ports on the switch, and wherein the table is configured in dependence on the tagged subset.

In one technology, the bus system includes an array of switches interleaved with the array of processors, and the configuration controller generates static route control signals applied to the switches in the array indicating positions of the switches relative to the tagged row. The routing logic, according to this technology, is responsive to the static route control signals, to forward data packets having a destination processor received on an input port on the switch to an output port on the switch that avoids the tagged subset.

In some embodiments, a device comprises an array of configurable units including a plurality of tiles of configurable units. The device including such plurality of tiles can be implemented on a single integrated circuit or single multi-chip module. In a technology described herein, processors in the spatially reconfigurable array comprise configurable units of more than one type. In an example, the configurable units can comprise functional configurable units designed to execute functional computation, such as arithmetic and logic functions, memory address computations and scratchpad memory functions; and interconnect configurable units, such as configurable switches, designed to perform communication protocol functions for interconnect structures. In a technology described herein, there are more than one type of functional configurable units, which in an example system includes Pattern Compute Units (PCUs) and Pattern Memory Units (PMUs) as described below.

A technology is described comprising an array of processors, where the processors in the array have array locations (e.g., row and column numbers), and are configurable to implement a data processing operation. The system includes a bus system connected to the processors in the array, with configurable logic to route packets of data among the processors in the array. The system includes one or more daisy-chained links through the processors in the array, such as daisy-chained control signal links and daisy-chained control status information links, connecting the processors in the array to a control circuit which operates in dependence on the daisy chain. In an embodiment, the system includes daisy-chain bypass circuits along the daisy chain, which bypass tagged elements of the array in the daisy chain, so that continuity of the daisy chain is maintained in the presence of unusable elements.

Other aspects and advantages of the technology described herein can be seen on review of the drawings, the detailed description and the claims, which follow.

DETAILED DESCRIPTION

The following description will typically be with reference to specific structural embodiments and methods. It is to be understood that there is no intention to limit the technology to the specifically disclosed embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows.

Figure 1:
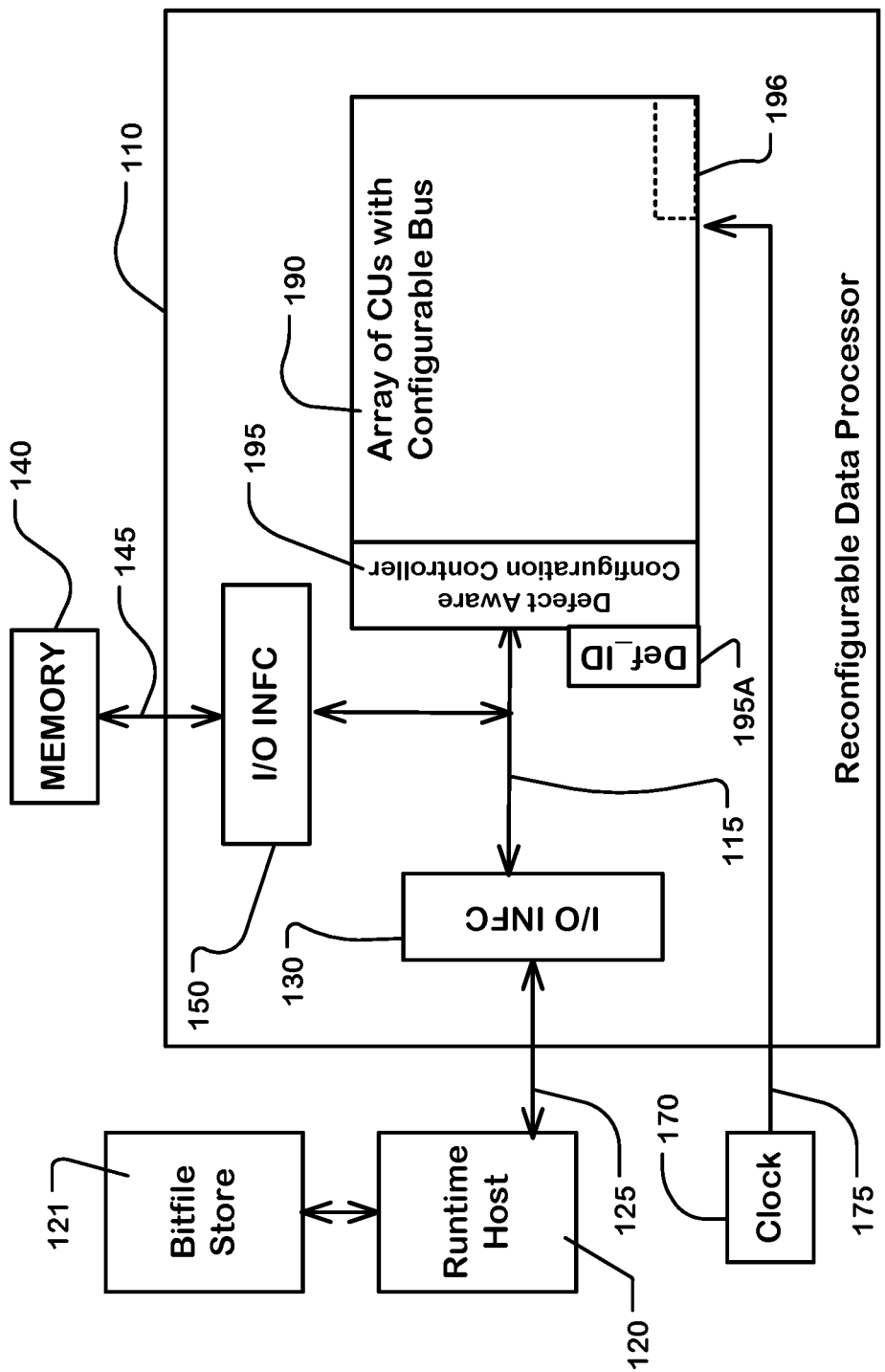
FIG. 1 is a system diagram illustrating a system including a host, a memory, and a reconfigurable data processor with defect repair logic.

FIG. 1 is a system diagram illustrating a system including a host 120, a memory 140, and a reconfigurable data processor 110.

As shown in the example of FIG. 1, the reconfigurable data processor 110 includes a spatially reconfigurable array 190 of processors.

The array 190 includes a spare sub-array 196 of configurable units, such as an extra row of configurable units.

A parameter store 195A is included that stores parameters (Def_ID) that tag defective or otherwise unusable elements of the array. The parameter store 195A can be a non-volatile memory, such as a fuse array or other write-once memory structure, that can be written during manufacturing and testing of the device. A technology is described herein in which the Def_ID tags a sub-array of the array 190 in which a defect is located, and which sub-array is homogeneous with the spare sub-array 196, such that the units of the configuration file placed in the initial configuration file in a tagged sub-array can be placed in the spare sub-array 196.

The processor 110 includes a defect-aware configuration controller 195, which comprises defect correction logic. The configuration controller can include a number of logical elements, including one or multiple memory access controllers and one or multiple configuration load/unload controllers, as described in more detail below. Also, the configuration controller 195 can include logic to generate static route control signals to the bus system and to the configurable units in the array, that indicate the physical location or relative physical location of the tagged or unusable elements of the array.

The phrase "configuration load/unload controller," as used herein, refers to a combination of a configuration load controller and a configuration unload controller. The configuration load controller and the configuration unload controller may be implemented using separate logic and data path resources, or may be implemented using shared logic and data path resources as suits a particular embodiment.

In this example, the reconfigurable data processor 110 is implemented on a single integrated circuit chip with defect correction logic which can improve manufacturing yield for the integrated circuit chip. An integrated circuit can be packaged in a single chip module or a multi-chip module (MCM). In other examples, the reconfigurable data processor is implemented using multiple chips packaged together to form an MCM with defect correction logic on one or more if the multiple chips, which can improve manufacturing yield for the multi-chip module. An MCM is an electronic package consisting of multiple integrated circuit die assembled into a single package, configured as a single device. The various die of an MCM are mounted on a substrate, and/or to each other using, for some examples, wire bonding, tape bonding or flip-chip bonding.

The processor 110 includes an external I/O interface 130 connected to the host 120 (e.g., runtime host) via lines 125, and an external I/O interface 150 connected to the memory 140 by line 145. The I/O interfaces 130, 150 connect via a bus system 115 to the array 190 of configurable units and to the configuration controller 195. The bus system 115 may have a bus width of one chunk of data, which can be, for this example, 128 bits (references to 128 bits throughout can be considered as an example chunk size more generally). In general, a chunk of the configuration file can have a number N of bits of data, and the bus system can be configured to transfer N bits of data in one bus cycle, where N is any practical bus width. A sub-file distributed in the distribution sequence can consist of one chunk, or other amounts of data as suits a particular embodiment. Procedures are described herein using sub-files consisting of one chunk of data each. Of course, the technology can be configured to distribute sub-files of different sizes, including sub-files that may consist of two chunks distributed in two bus cycles, for example.

To configure configurable units in the array 190 of configurable units with a configuration file for an application graph, the host 120 can access memory 121 storing a configuration file (e.g. a bit file) or many configuration files, and send a selected configuration file to the memory 140 via the interface 130, the bus system 115, and the interface 150 in the reconfigurable data processor 110. The configuration file can be loaded in many ways, as suits a particular architecture, including in data paths outside the configurable processor 110. The configuration file can be retrieved from the memory 140 via the memory interface 150. Chunks of the configuration file for an application graph can then be sent in a distribution sequence as described herein to place unit configuration files in the configurable units in array 190, according to a placement based on the parameters in the parameter store, the initial placement in the configuration file and the spare configurable units in the sub-array 196.

An example technology for loading and unloading configuration files in an array of configurable units is described in U.S. Pat. No. 10,831,507, entitled CONFIGURATION LOAD OF A RECONFIGURABLE DATA PROCESSOR, issued Nov. 10, 2020, by Shah et al., which is incorporated by reference as if fully set forth herein.

An application graph for the purposes of this description includes the configuration file for units in the spatially reconfigurable array compiled to execute a mission function procedure or set of procedures using the device, such as inferencing or learning in an artificial intelligence or machine learning system.

An external clock generator 170 or other internal or external clock signal source can provide a clock signal 175 or clock signals to elements in the reconfigurable data processor 110, including the array 190 of configurable units, and the bus system 115, and the external data I/O interfaces.

Figure 2:
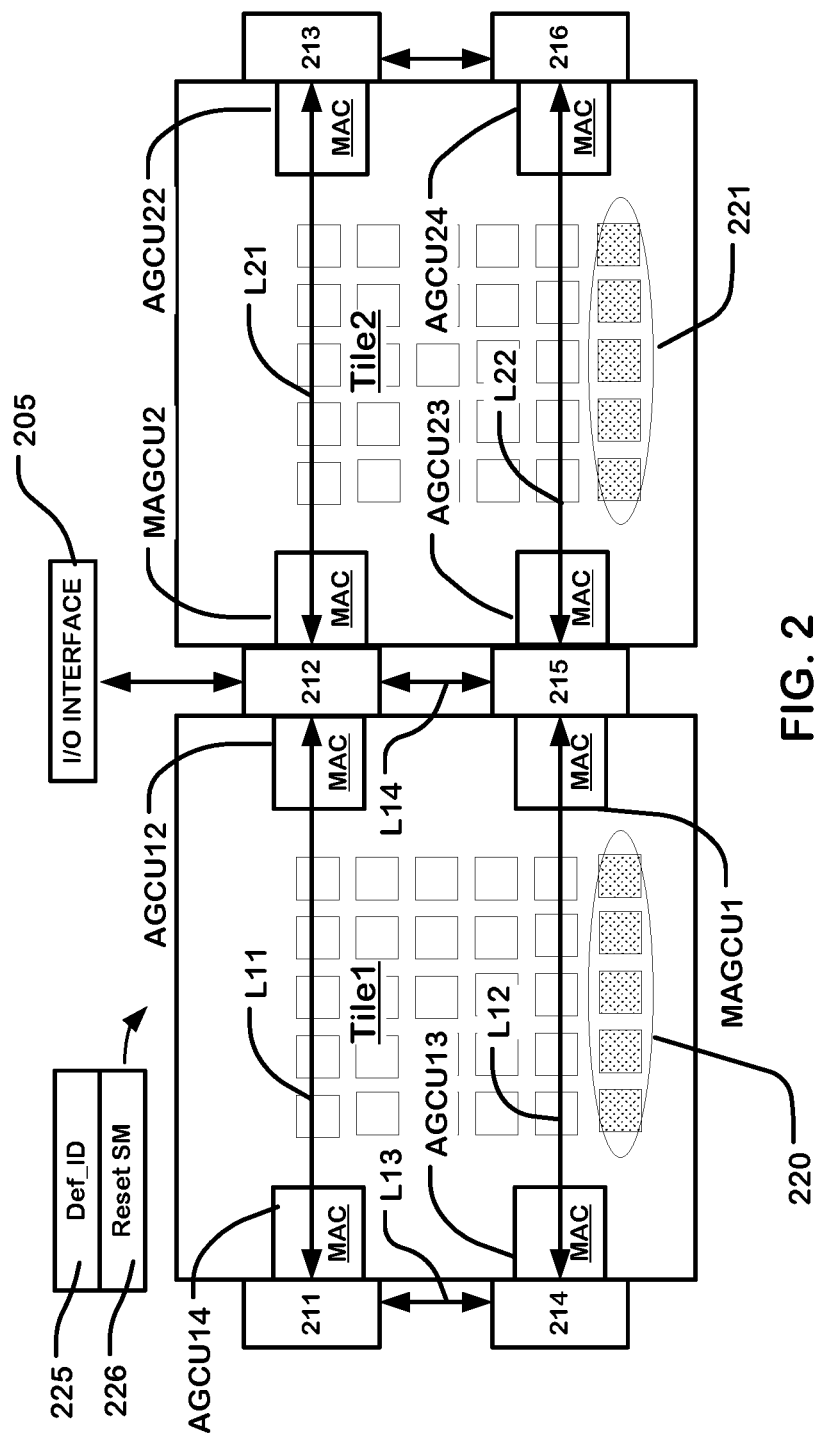
FIG. 2 is a simplified block diagram of a top level network and components of a CGRA (Coarse Grain Reconfigurable Architecture) including a spare row of configurable units.

FIG. 2 is a simplified block diagram of components of a CGRA (Coarse Grain Reconfigurable Architecture) processor which can be implemented on a single integrated circuit die or on a multichip module. In this example, the CGRA processor has 2 tiles (Tile1, Tile2). Each tile comprises an array of configurable units connected to a bus system, including an array level network in this example, the bus system including an array of interconnect configurable units interleaved with the array of functional configurable units. Each tile in this example includes a spare row (220, 221) of configurable units. The spare rows 220, 221 are, by default, unused rows of configurable units in the compilation of the configuration files, and used in a changed placement of the unit configuration files of the configuration file in the event another row is tagged as unusable.

The bus system includes a top level network connecting the tiles to external I/O interface 205 (or any number of interfaces). In other embodiments, different bus system configurations may be utilized. The configurable units in each tile, including the units in the spare rows, are addressable nodes on the array level network in this embodiment.

In an example embodiment, each of the tiles has four functional configurable units referred to as AGCUs (Address Generation and Coalescing Units) (e.g. MAGCU1, AGCU12, AGCU13, AGCU14). The AGCUs are nodes on the top level network and nodes on the array level networks, and include resources for routing data among nodes on the top level network and nodes on the array level network in each tile. In other embodiments, different numbers of AGCUs may be used, or their function may be combined with other components in the CGRA processor or reconfigurable elements in the tile.

Nodes on the top level network in this example include one or more external I/O interfaces, including interface 205. The interfaces to external devices include resources for routing data among nodes on the top level network and external devices, such as high-capacity memory, host processors, other CGRA processors, FPGA devices and so on, that are connected to the interfaces.

One of the AGCUs in a tile is configured in this example to be a master AGCU, which includes an array configuration load/unload controller for the tile. In other embodiments, more than one array configuration load/unload controller can be implemented and one array configuration load/unload controller may be implemented by logic distributed among more than one AGCU. All of the AGCUs in a tile include a memory access controller (MAC) in this example. In other embodiments, a memory access controller can be implemented as a separate node on the array level and top level networks, and include logic to act as a gateway between the array level and top level networks. The memory access controller can include address registers and address translation logic configurable to confine accesses to memory outside the array of configurable units to memory space allocated to sets of configurable units from which the accesses originate, or to which data from memory outside the array of configurable units is directed.

The MAGCU1 includes a defect aware, configuration load/unload controller for Tile1, and MAGCU2 includes a defect aware, configuration load/unload controller for Tile2, in this example. In other embodiments, a configuration load/unload controller can be designed for loading and unloading a configuration of more than one tile. In other embodiments, more than one configuration controller can be designed for a configuration of a single tile. Also, the configuration load/unload controller can be implemented in other portions of the system, including as a stand-alone node on the top level network and the array level network or networks.

The tiles illustrated in FIG. 2 are implemented on a single integrated circuit substrate in some embodiments. As illustrated, a non-volatile parameter store 225, such as an eFUSE circuit, store a parameter that tags an unusable element, if any, of an array in each tile in this example. In one embodiment, a reset state machine 226 on the integrated circuit substrate reads the parameter store 225 on reset, and provides a defect table to the configuration load/unload controllers for each tile.

The top level network is constructed using top level switches (211-216) connecting to each other as well as to other nodes on the top level network, including the AGCUs, and I/O interface 205. The top level network includes links (e.g. L11, L12, L21, L22) connecting the top level switches. Data travels in packets between the top level switches on the links, and from the switches to the nodes on the network connected to the switches. For example, top level switches 211 and 212 are connected by a link L11, top level switches 214 and 215 are connected by a link L12, top level switches 211 and 214 are connected by a link L13, and top level switches 212 and 213 are connected by a link L21. The links can include one or more buses and supporting control lines, including for example a chunk-wide bus (vector bus). For example, the top level network can include data, request and response channels operable in coordination for transfer of data in a manner analogous to an AXI compatible protocol. See, AMBA® AXI and ACE Protocol Specification, ARM, 2017.

Top level switches can be connected to AGCUs. For example, top level switches 211, 212, 214 and 215 are connected to MAGCU1, AGCU12, AGCU13 and AGCU14 in the tile Tile1, respectively. Top level switches 212, 213, 215 and 216 are connected to MAGCU2, AGCU22, AGCU23 and AGCU24 in the tile Tile2, respectively.

Top level switches can be connected to one or more external I/O interfaces (e.g. interface 205).

Figure 3:
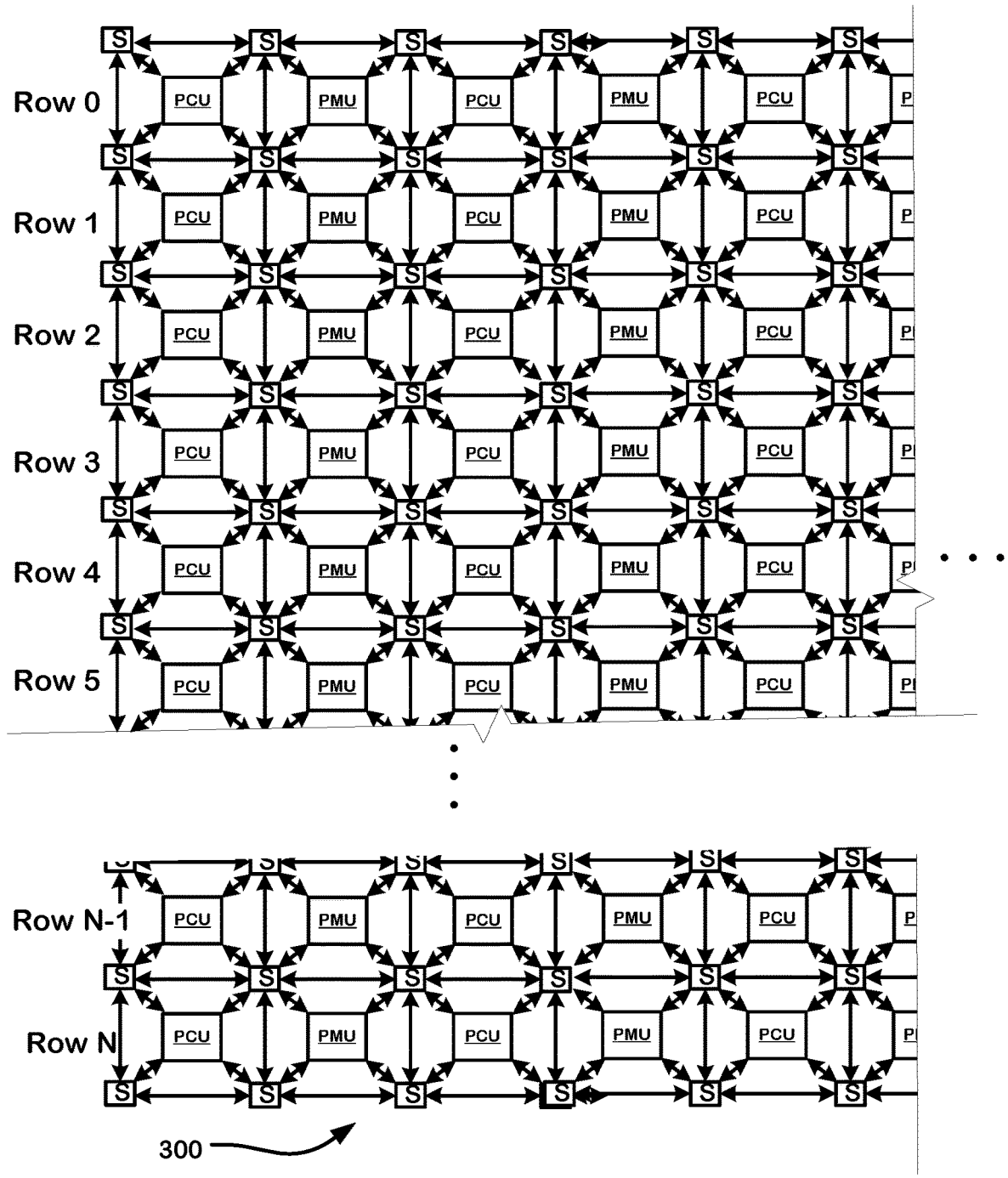
FIG. 3 is a simplified diagram of a tile and an array level network usable in the configuration of FIG. 2, where the configurable units in the array are nodes on the array level network.

FIG. 3 is a simplified diagram of a tile and an array level network usable in the configuration of FIG. 2, where the configurable units in the array are nodes on the array level network.

The array of configurable units 300 consists in this example of rows and columns of processors, each of which is a configurable unit. In another example, the array can comprise multiple stacked planes, each plane including rows and columns. As illustrated, the array of configurable units includes N+1 homogeneous sub-arrays, the rows labeled Row 0 to Row N, and the columns unlabeled in this figure. Also, the array of configurable units includes N+2 rows of switch units S that form the routing infrastructure of the array level network (unlabeled). In this example, Row N is a spare row, which is by default unused. When a different row is tagged as unusable, a new placement of the configuration file can be implemented using Row N. The rows, Row 0 to Row N, are homogeneous because each row includes the same number, same types and same spatial arrangement of configurable units (PMUs and PCUs). In other embodiments, the homogeneous sub-array can be columns. In other embodiments, other spare geometries, such as rectangles consisting of a contiguous subset of rows and columns of homogeneous sub-arrays, may be utilized.

The configurable units can include two kinds of coarse-grained reconfigurable units: Pattern Compute Units (PCUs) and Pattern Memory Units (PMUs). The PMUs and PCUs are homogeneous across the architecture. Each PCU is a processor having a reconfigurable pipeline with multiple stages of single instruction, multiple data SIMD functional units, with support for cross-SIMD lane shifting and reduction. PMUs are processors composed of a banked scratchpad memory and dedicated addressing logic and address decoders. These units can communicate with each other through a bus system, such as a pipelined static hybrid interconnect with separate bus-level and word-level data, and bit-level control networks.

In the embodiment illustrated, the alternating columns include either PCUs or PMUs, so the adjacent columns are not homogeneous. A homogeneous sub-array for this example could be composed of two adjacent columns—one column of PCUs and one column of PMUs, so long as there is an even number of columns. In other embodiments, homogeneous sub-arrays could have other arrangements. For example, in a stacked structure having multiple planes of two-dimensional arrays of configurable units, a homogeneous sub-array could include configurable units on more than one plane.

In this example, the array of configurable units 300 includes a plurality of types of configurable units. The types of configurable units in this example, include Pattern Compute Units (PCU), Pattern Memory Units (PMU), switch units (S), and Address Generation and Coalescing Units (each including two address generators AG and a shared CU). For an example of the functions of these types of configurable units, see, Prabhakar et al., "Plasticine: A Reconfigurable Architecture For Parallel Patterns", ISCA '17, Jun. 24-28, 2017, Toronto, ON, Canada, which is incorporated by reference as if fully set forth herein. Each of these configurable units contains a configuration store comprising a set of registers or flip-flops that represent either the setup or the sequence to run a program, and can include the number of nested loops, the limits of each loop iterator, the instructions to be executed for each stage, the source of the operands, and the network parameters for the input and output interfaces.

Additionally, each of these configurable units contains a configuration store comprising a set of registers or flip-flops that store status usable to track progress in nested loops or otherwise. A configuration file contains a bit-stream representing the initial configuration, or starting state, of each of the components that execute the program. This bit-stream is referred to as a bit file. Program load is the process of setting up the configuration stores in each unit in the array of configurable units using unit configuration files based on the contents of the bit file to allow all the components to execute a program (i.e., a machine). Program Load may also require the load of all PMU memories, which may or may not be part of a unit configuration file for the PMU.

Figure 3A:
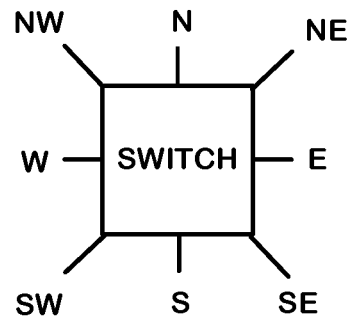
FIG. 3A illustrates an example arrangement of ports on a switch unit connecting elements in an array level network.

FIG. 3A illustrates an example switch unit connecting elements in an array level network. As shown in the example of FIG. 3A, a switch unit can have 8 interfaces. The North, South, East and West interfaces of a switch unit are used for connections between switch units. The Northeast, Southeast, Northwest and Southwest interfaces of a switch unit are each used to make connections to physically adjacent functional configurable units, e.g. PCU or PMU instances.

Figure 3B:
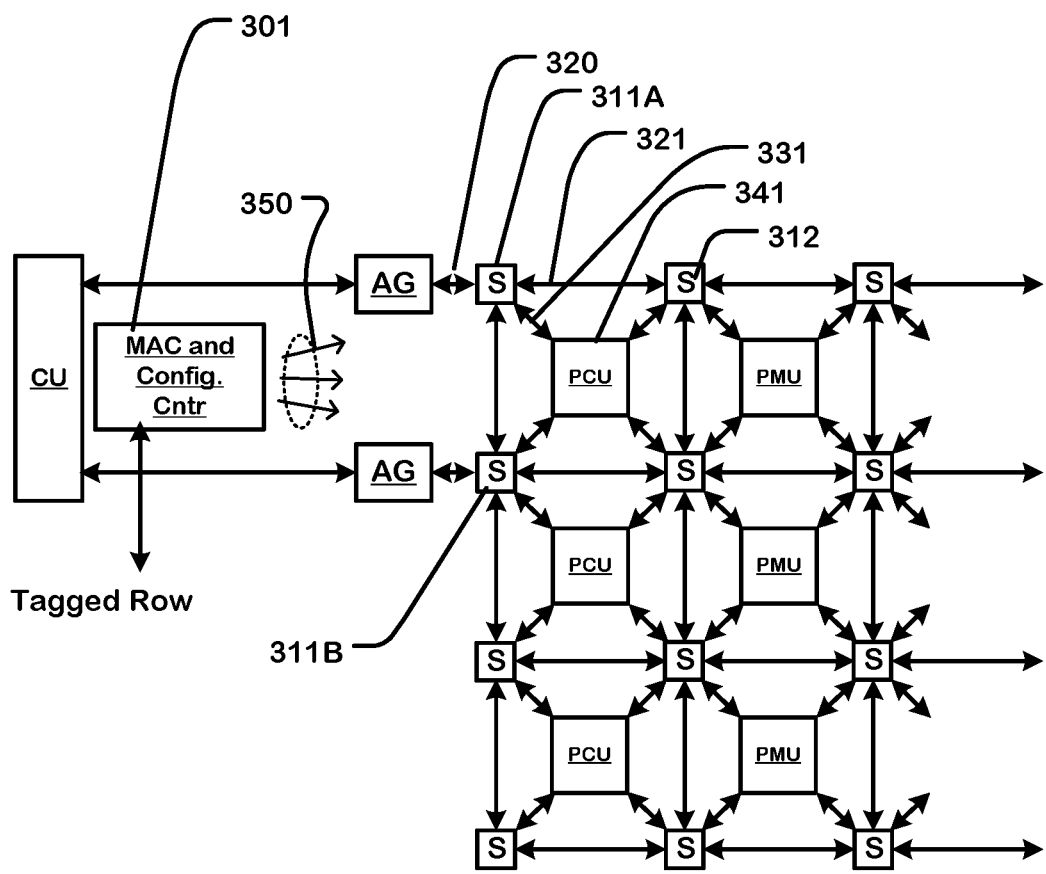
FIG. 3B illustrates an architecture including defect aware configuration control logic for a tile including an array of configurable units.

FIG. 3B illustrates connection of a master address generator and coalesce unit MAGCU including a configuration controller to an array of configurable units for an example like that of FIG. 3. A coalesce unit CU is connected to two address generators AG in this example. A defect aware configuration controller 301 is coupled to the address generators and coalesce unit, and to the array level bus, by connection to adjacent switch units (311A, 311B). The defect aware configuration controller 301 can receive control signals indicating an unusable row (tagged sub-array or row), and generate repair control signals connected on lines 350 to each configurable unit in the tile, in which circuits respond to the repair control signals to adjust operations in dependence on the tagged row. The repair control signals can be transmitted on links that are static on reset and connect directly to corresponding configurable units in a point-to-point arrangement.

The array level network includes links interconnecting configurable units in the array. The links in the array-level network include one or more and, in this case, three kinds of physical buses: a chunk-level vector bus (e.g. 128 bits of data), a word-level scalar bus (e.g. 32 bits of data), and a multiple bit-level control bus. For instance, interconnect 321 between switch units 311A and 312 includes a vector bus interconnect with a vector bus width of 128 bits, a scalar bus interconnect with a scalar bus width of 32 bits, and a control bus interconnect.

The three kinds of physical buses differ in the granularity of data being transferred. In one embodiment, the vector bus can carry a chunk that includes 16-Bytes (=128 bits) of data as its payload. The scalar bus can have a 32-bit payload, and carry scalar operands or control information. The control bus can carry control handshakes such as tokens and other signals. The vector and scalar buses can be packet switched, including headers that indicate a destination of each packet and other information such as sequence numbers that can be used to reassemble a file when the packets are received out of order. Each packet header can contain a destination identifier that identifies the spatial coordinates of the destination switch unit (e.g. the row and column in the array), and an interface identifier that identifies the interface connected to destination configurable unit (e.g. using geographical metaphor—NorthEast, SouthEast, NorthWest, SouthWest, etc.) used to reach the destination unit. The control network can be circuit switched based on timing circuits in the device, for example.

In one example, a chunk of data of 128 bits is transmitted on the vector bus that provides the chunk as vector inputs to a configurable unit. The vector bus can include 128 payload lines, and a set of header lines. The header can include a sequence ID for each chunk, which can include:

A bit to indicate if the chunk contains scratchpad memory or configuration store data.
Bits that form a chunk number.
Bits that indicate a column identifier.
Bits that indicate a row identifier.
Bits that indicate a component identifier.

For a load operation, the configuration load controller can send the number N of chunks of a unit configuration file to a configurable unit in order from N−1 to 0. For this example, the 6 chunks are sent out in most significant bit first order of Chunk 5->Chunk 4->Chunk 3->Chunk 2->Chunk 1->Chunk 0. (Note that this most significant bit first order results in Chunk 5 being distributed in round 0 of the distribution sequence from the array configuration load controller.) For an unload operation, the configuration unload controller can write the unload data out of order to the memory. For both load and unload operations, the shifting in the configuration serial chains in a configuration data store in a configurable unit is from LSB (least-significant-bit) to MSB (most-significant-bit), or MSB out first.

A set of one or more switch units in each tile quadrant has connections to an Address Generation and Coalescing Unit (AGCU) that include multiple address generation (AG) units and a coalescing unit (CU) connected to the multiple address generation units. The coalescing unit (CU) arbitrates between the AGs and processes memory requests. Each of the 8 interfaces of a switch unit can include a vector interface, a scalar interface, and a control interface to communicate with the vector network, the scalar network, and the control network.

In embodiments described herein, a configuration file or bit file, before configuration of the tile, can be sent from the configuration load controller using the same vector bus, via one or more unit switches and one or more links between the unit switches to the configurable unit using the vector bus and vector interface(s) of the one or more switch units on the array level network. For instance, referring to FIG. 3B, a chunk of configuration data in a unit configuration file particular to a configurable unit PCU 341 can be sent from the configuration load/unload controller 301 to the PCU 341, via a link 320 between the configuration load/unload controller 301 and the West (W) vector interface of the switch unit 311A, the switch unit 311B, and a link 331 between the Southeast (SE) vector interface of the switch unit 311A and the PCU 341.

In this example, one of the AGCUs is configured to be a master AGCU, which includes a defect aware, configuration load/unload controller (e.g. 301), which receives a parameter (tagged row id) identifying an unusable sub-array. The master AGCU implements a register through which the host (120, FIG. 1) can send commands via the bus system to the master AGCU. The master AGCU controls operations on an array of configurable units in a tile and implements a program control state machine to track the state of the tile based on the commands it receives from the host through writes to the register. For every state transition, the master AGCU issues commands to all components on the tile over a daisy-chained command bus described below. The commands include a program reset command to reset configurable units in an array of configurable units in a tile, and a program load command to load a configuration file to the configurable units.

The configuration load controller in or linked to the master AGCU is responsible for reading the configuration file from the memory and sending the unit configuration file in the configuration data to every configurable unit of the tile. The master AGCU can read the configuration file from the memory at preferably the maximum throughput of the top level network. The data read from memory are transmitted by the master AGCU over the vector interface on the array level network to the corresponding configurable unit according to a distribution sequence described herein.

In one embodiment, in a way that can reduce the wiring requirements within a configurable unit, configuration and status registers holding unit configuration files to be loaded in a configuration load process, or unloaded in a configuration unload process in a component are connected in a serial chain and can be loaded through a process of shifting bits through the serial chain. In some embodiments, there may be more than one serial chain arranged in parallel or in series. When a configurable unit receives the for example 128 bits of configuration data from the master AGCU in one bus cycle, the configurable unit shifts this data through its serial chain at the rate of 1 bit per cycle, where shifter cycles can run at the same rate as the bus cycle. It will take 128 shifter cycles for a configurable unit to load 128 configuration bits with the 128 bits of data received over the vector interface. The 128 bits of configuration data are referred to as a chunk. A configurable unit can require multiple chunks of data to load all its configuration bits.

The configurable units interface with the memory through multiple memory interfaces (150, FIG. 1). Each of the memory interfaces can be accessed using several AGCUs. Each AGCU contains a reconfigurable scalar datapath to generate requests for the off-chip memory. Each AGCU contains buffers for organizing data to buffer outgoing commands, data, and incoming responses from the off-chip memory.

The address generators AGs in the AGCUs can generate memory commands that are either dense or sparse. Dense requests can be used to bulk transfer contiguous off-chip memory regions, and can be used to read or write chunks of data from/to configurable units in the array of configurable units. Dense requests can be converted to multiple off-chip memory burst requests by the coalescing unit (CU) in the AGCUs. Sparse requests can enqueue a stream of addresses into the coalescing unit. The coalescing unit uses a coalescing cache to maintain metadata on issued off-chip memory requests and combines sparse addresses that belong to the same off-chip memory request to minimize the number of issued off-chip memory requests.

Each of the AGCUs in the illustrated embodiment can include a memory access controller MAC. Each of the memory access controllers can be dedicated to any of the configurable units in the tile. Alternatively, different graphs set up by a configuration file may reside on different partitioned sets of configurable units in the tile, and each of the partitioned sets can be allocated by the configuration file to one of the memory access controllers connected to a switch inside the partitioned set.

Figure 4:
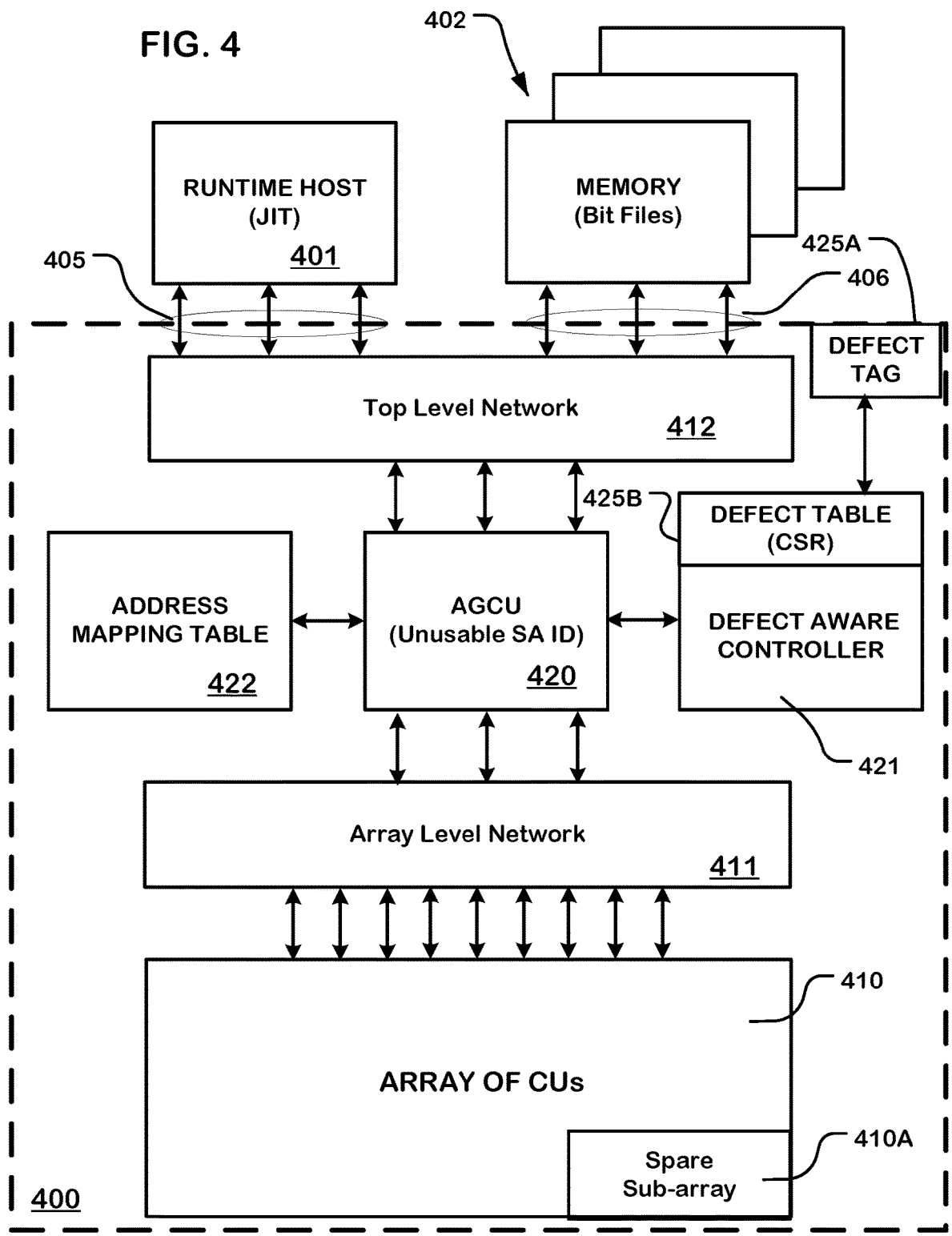
FIG. 4 is a block diagram of a system including an array of configurable units and resources implementing defect aware configuration.

FIG. 4 is a simplified block diagram illustrating a system including a CGRA device 400 coupled to an external host 401 and external memory 402. There can be a plurality of interfaces 405 coupling the device 400 to the host 401 which can execute a runtime processor program, including for example PCIE type interfaces or other types of interfaces suitable to a particular implementation. One or more of the interfaces 405 can be network connections, including Internet-based network connections. The host 401 can comprise any system, including cloud-based systems capable of executing a runtime program in coordination with the device 400.

In some embodiments, the runtime program can include or operate with a just-in-time JIT compiler, which is responsive to data identifying unusable elements, or unusable sub-arrays, of the array of configuration units 410, to change the configuration file to be used for configuration the array.

There can be a plurality of interfaces 406 coupling the device 400 to memory 402, including for example high-speed double-data-rate interfaces suitable for connection to high density DRAM memory, or other types of interfaces suitable for a particular implementation.

The CGRA device 400 includes an array 410 of configurable units that is coupled to an array level network 411. The array 410 includes a plurality of homogeneous sub-arrays as discussed above, and includes at least one spare homogeneous sub-array 410A.

The array level network 411 is also coupled to one or more address generation and coalescing units AGCUs 420. The AGCUs 420 are coupled to a top level network 412, which in turn is coupled to the interfaces 405, 406 for communication with external resources including the external host 401 and the external memory 402.

The AGCUs 420 include logic that acts as a gateway between the array level network 411 and the top level network 412.

The gateway function of the AGCUs includes a memory access controller that utilizes, in this example, a mapping table 422 that maps memory space used by configurable units in the array 410 to regions in memory allocated to graphs that are implemented by the configurable units.

The AGCUs in this example also include a defect-aware configuration controller used to load and unload graphs from corresponding sets of configurable units in the array which can be defect aware. The AGCUs in this example are connected to a controller 421 which can include a reset state machine or other logic. The controller 421 includes, or has access to, a defect table 425B. On reset, or other suitable event, the controller downloads "defect tag" parameters from a non-volatile parameter store 425A such as an eFUSE store, which identifies unusable rows in each tile. The controller loads defect information in the defect table 425B in dependence on the tagged unusable row (or rows), which can be the spare row (or rows) by default, or a row or rows in which at least one unusable element is located during testing. The defect table 425B can comprise a control status register CSR for the tile, which can be included in a control status register daisy chain through the CSR registers in configurable units of the tile. The defect map information is applied to an AGCU 420 for each tile, which includes circuits to distribute repair control signals to configurable units and other circuits in the array 410. The repair control signals are utilized by circuitry in the array in some embodiments to bypass unusable elements of the array, in some embodiments to reroute communications among the elements to avoid unusable elements, and in some embodiments to control routing among configurable units in the array.

In some embodiments, the defect table 425B includes a register storing a row identifier including a row number of the unusable row in each tile. The controller 421 can send the unusable row number (e.g. 4 bits for systems with up to 16 rows) corresponding to the tile to the master AGCU for the tile. The bits routed from the controller 421 to the AGCU can be repair control signals transmitted on static links (e.g. global wires) which are not timed and are static after reset. A "global wire" as used herein is a circuit which carries a control signal from a source circuit, such as a register which can be set during a reset based on the tagged unusable element, to a destination circuit which is responsive to the control signal. The global wire can be a conductor driven by a signal in a register, such as a metal line providing direct connections, or in some cases a conductor that is buffered along its length as needed to satisfy minimum requirements like slew rates to avoid crowbar current.

The runtime program in host 401 can implement a just-in-time compiler (JIT) which will read the UNUSABLE_ROW_ID_CSR and obtain the unusable row number for each tile. It can then read the bit file, and modify it by forming a new placement of unit configuration files to use the operational rows, including any needed spare row or rows, of the tile on which the bit file is to be loaded (avoiding the tagged row(s)). The goal of JIT is to minimize the movement of unit configuration files for the graph and maintain adjacency by, for example, preserving relative placement of the unit configuration files for the components as described in the initial configuration file.

Consider one possible example procedure which highlights some of the functions implemented by JIT. A 26-row bit file (i.e. having 26 configuration sub-array data block) is scheduled to be loaded on a tile, and Runtime determines that row 4 of the tile is unusable by reading the Unusable_Row_CSR. A just-in-time compiler will remap the initial bit file provided to not use row 4 and instead use row 26 which is the spare row. One possible way the remap could be done is:

1. Leave the placement of unit configuration files for functional configurable units on rows 0-3 unchanged from the initial bit file.

2. Shift the placement of unit configuration files for functional configurable units on row 4 to row 5, row 5 to row 6, and so forth, preserving adjacency of the configuration. Configuration for row 25 will be shifted the spare row 26.

3. All Switch programming and flow tables will be modified correspondingly, as described below.

Other JIT procedures can be utilized. For example, another option would be for the compiler to compile N+1 versions of each bit file for each tile, where N+1 is the number of homogeneous sub-arrays available on a tile including a spare, e.g. one for each possible unusable homogeneous row including the spare row. The JIT would then select one of the N+1 bit files based on the tagged row. To limit the size of memory needed to store N+1 versions of the bit file, software could employ compression techniques. The selected bit files would then be uncompressed on the host prior to being loaded into the tile.

In some embodiments, a compiler and Runtime software can be responsible for generating a bit file for the graph to be executed on a tile with following goals:

1. The bit file does not use any components on a tagged unusable row of a tile.

2. The graph produces identical results for varying unusable rows.

3. The graph has minimal variability in performance for varying unusable rows.

In one example, the controller 421 provides AGCU 420 (which can be a master AGCU) the unusable row identifier, which includes logic to decode the unusable row identifier and generate repair control signals including in one arrangement, 1 bit for each row on the tile. These bits (UNUSABLE_ROW_BITS[N−1:0]) can be driven out of AGCU 420 as global wires on the tile. If no rows are unusable (which can be signaled by setting the unusable row identifier is 0), then the spare row is unused and all UNUSABLE_ROW_BITS driven out by the Master AGCU are 0. All configurable units on a row will receive 1 bit of UNUSABLE_ROW_BITS[N−1:0] corresponding to its physical row.

In one example, all switches on a row will receive repair control signals including two UNUSABLE_ROW_BITS: Bit 0 corresponds to the physical row of the switch. If the Switch row matches a tagged row, then Bit 0 will be set. Bit 1 will correspond to switch (row−1). If (row−1) above the switch row is unusable, then Bit 1 will be set.

In an example of the technology, the JIT updates the configuration file in dependence on the tagged row, so that the bit file being loaded should not direct configuration files to any component in the tagged row. Repair logic circuits in the configuration controller at AGCU 420 in this case, can perform functions including:

During Program Load, AGCU 420 will drop all configuration packets intended for functional configurable units (PCUs and PMUs) on a tagged row.

During Argument Load, AGCU 420 will drop all configuration packets intended for configurable units on a tagged row.

During Program Unload, configurable units on a tagged row will not send any unload packets to AGCU 420. The configuration controller 421 and AGCU 420 will account for this in controlling the program unload state machine. Memory locations which hold unload data corresponding to the unusable components will not be updated by the AGCU 420.

All configurable units will receive a repair control signal which indicates if the functional configurable unit is on an unusable row. This can be an untimed signal on a global wire. If this control signal is SET, then PCU and PMU will do the following:

Bypass its program_load_done_in input to its program_load_done_out output.

Bypass its csr_ring_in input to its csr_ring_out output.

Control and status registers (CSRs) may be used in reconfigurable processor units to enable direct interaction with software or other system agents for alternative configuration or operation control, to communicate exceptional results, or other purposes. CSRs on unusable rows should not be accessed as the logic is potentially unreliable and can cause unintended failures in some embodiments. Therefore, software should not issue any reads or writes to CSRs on unusable rows. AGCU repair logic circuits can intercept CSR accesses to unusable rows, drop CSR writes and return CSR read data with dummy data, such as all 1's. A maskable interrupt can be implemented and if enabled, an interrupt will be triggered on CSR access to unusable rows to alert software of a programming error.

FIGS. 5 to 8 are flow charts for embodiments of procedures to change placement and routing of configuration files in dependence on tagged unusable elements of an array of processors.

A system is described including a runtime processor and memory accessible to the runtime processor storing a host program executable to provide the configuration data to the configuration controller of a spatially reconfigurable array of processors. In one technology, the system includes memory storing a pre-compiled initial configuration file, and a runtime processor executes a procedure ("just-in-time compiler") which modifies the pre-compiled configuration file in dependence on the tagged homogeneous sub-array to provide the placements updated in dependence on the tagged element. Also, in some embodiments, the runtime processor executes a procedure which modifies the routing information in the pre-compiled initial configuration file in dependence on the tagged element.

Figure 5:
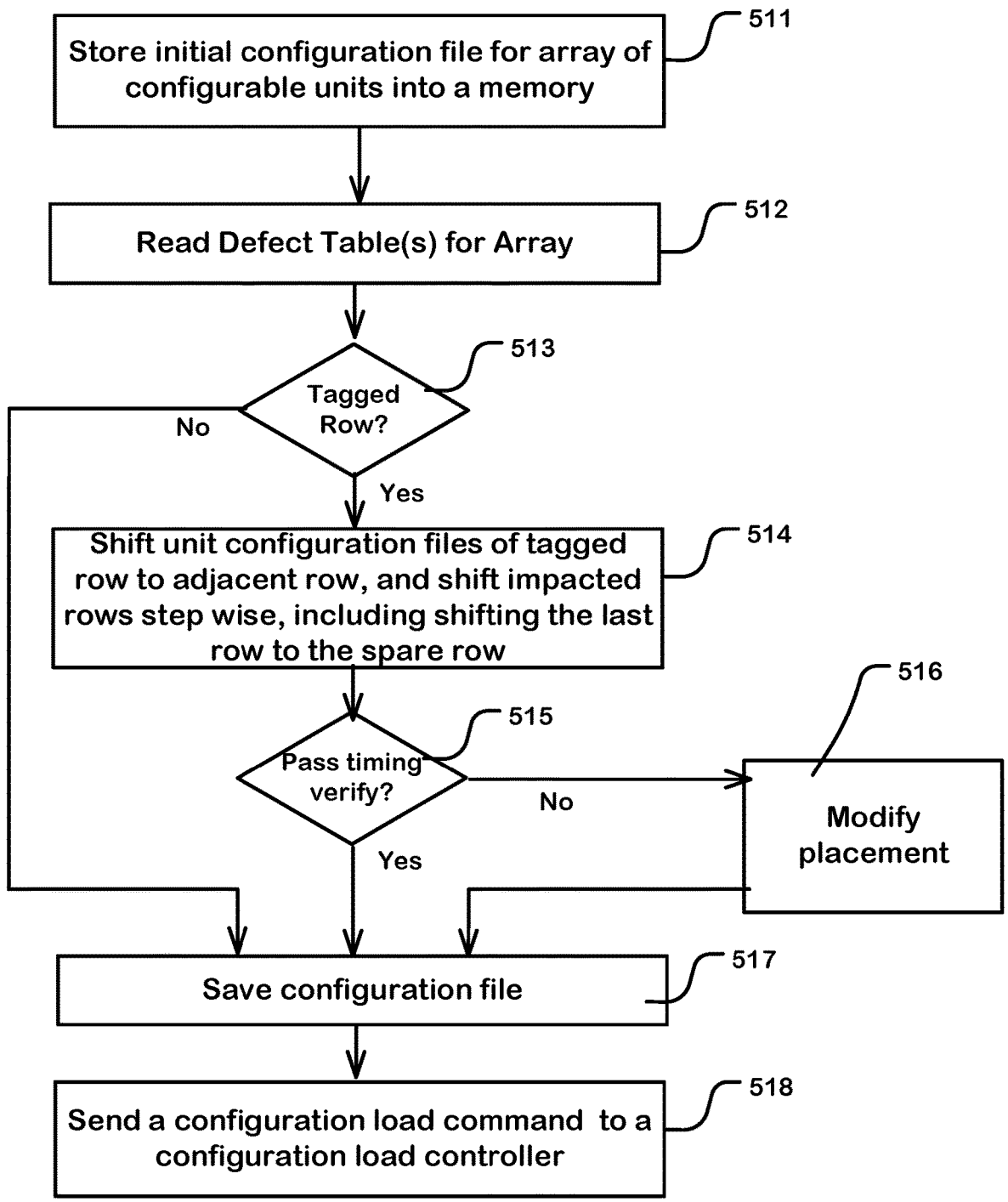
FIG. 5 is a flowchart of a procedure executed using a just-in-time compiler for a defect aware system like that of FIG. 4.

FIG. 5 is a flow chart for a procedure executed by a just-in-time compiler illustrating a case where only one spare row exists. The procedure includes storing an initial configuration file in memory, for an array of configurable units (511). The procedure reads the defect table or other memory storing a parameter tagging a row (or in general, any other element or other sub-array), of the array of configurable units as unusable (512). If there is no tagged row, then the procedure skips to step 517. If a row is tagged unusable (513), then the procedure shifts the unit configuration files of the tagged row to an adjacent row, and shifts the unit configuration file impacted by the shift step-wise, including shifting the unit configuration files placed in the last row, if utilized, to the spare row (514). Next, in some embodiments, the procedure includes executing a timing verification operation over the shifted configuration to ensure performance goals are achieved (515). If the shifted configuration file passes timing verification, then the shifted configuration file is saved (517). Then the procedure signals a runtime program to send a configuration load command to a configuration load controller for the array (518).

If at step 515, the shifted configuration file does not pass timing verification, then the procedure can execute a procedure to modify the placement in order to satisfy the specifications (516). Alternatively, the procedure can signal failure. After modifying the shifted placement, the procedure can transition to step 518. In some embodiments as described herein, the shifting can be executed on homogeneous sub-array basis, by which timing verification operations are unlikely to fail, and in such cases, the timing verification operation can be omitted.

In another technology, the memory stores a plurality of pre-compiled configuration files, each including a placement to be used in case a particular tagged sub-array of the array is unusable, and a runtime processor executes a procedure to select, in dependence on the tagged sub-array, one of the pre-compiled configuration files as the configuration file. The pre-compiled configuration files can have placements compiled for respective tagged homogeneous sub-arrays.

Figure 6:
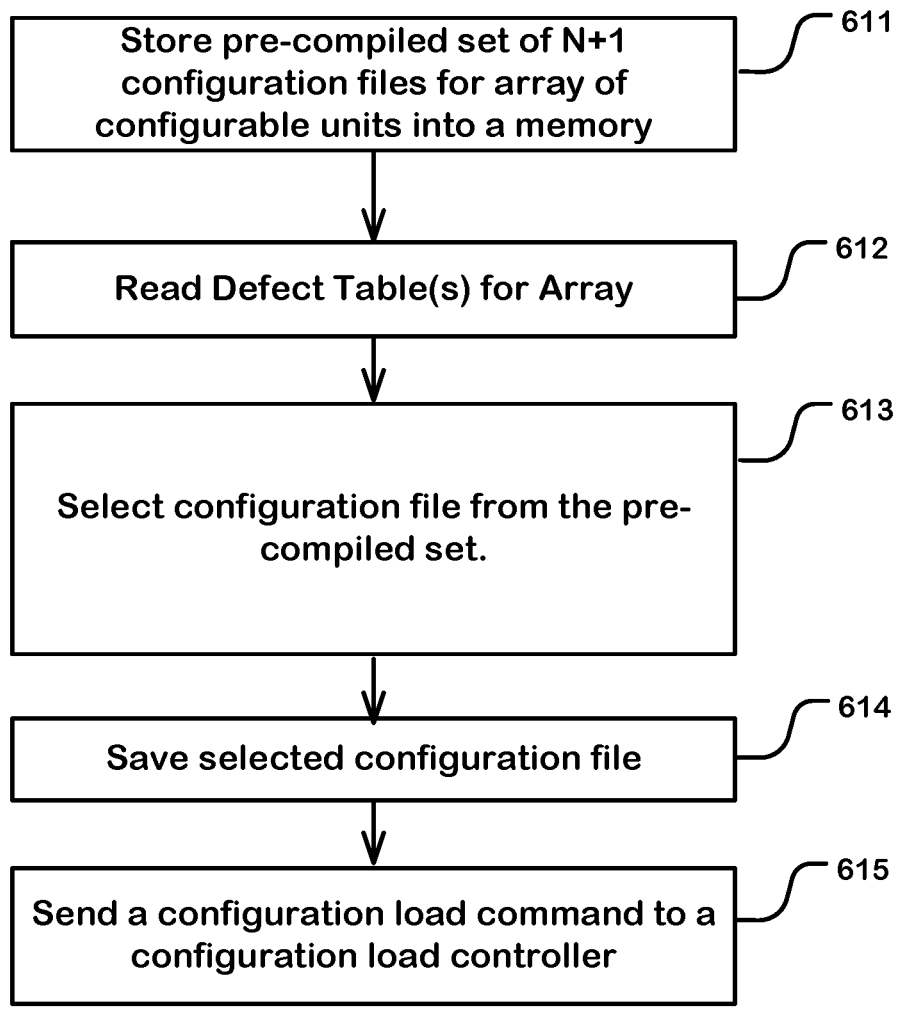
FIG. 6 is a flowchart of a procedure executed using a just-in-time compiler for a defect aware system like that of FIG. 4 according to another embodiment.

FIG. 6 illustrates a procedure for a host system based on use of a plurality of pre-compiled configuration files. In this procedure, assuming an array including N+1 homogeneous sub-arrays, a pre-compiled set of N+1 configuration files for an array of configurable units is stored in a memory (611). The procedure reads the defect table or other memory storing a parameter tagging an element, such as a row or other sub-array, of the array of configurable units as unusable (612). In response to the tagged sub-array, the procedure selects a configuration file from the pre-compiled set (613). The pre-compiled set can include selectable configuration files which, relative to a default placement assuming no tagged elements, shifts unit configuration files of tagged row appropriately. In the case of use of spare rows, the selectable set of configuration files shift a tagged row to an adjacent row, and shift impacted rows step-wise, including shifting the last row if utilized in the default configuration to the spare row (or homogeneous sub-array). Then, the selected configuration file is saved in memory (614). The procedure then signals a runtime program to send a configuration load command to a configuration load controller for the array (615).

In another technology, the memory stores a pre-compiled configuration file which includes a routing data set. The routing data set can include pre-compiled routing configuration data sets, each including routing information to be used in case a particular tagged sub-array of the array is unusable. The routing information can include unit configuration files for the interconnect configurable units, such as switches, in the array. The runtime processor executes a procedure to select, in dependence on the tagged homogeneous sub-array, one of the pre-compiled routing configuration data sets to be loaded with the configuration file.

Figure 7:
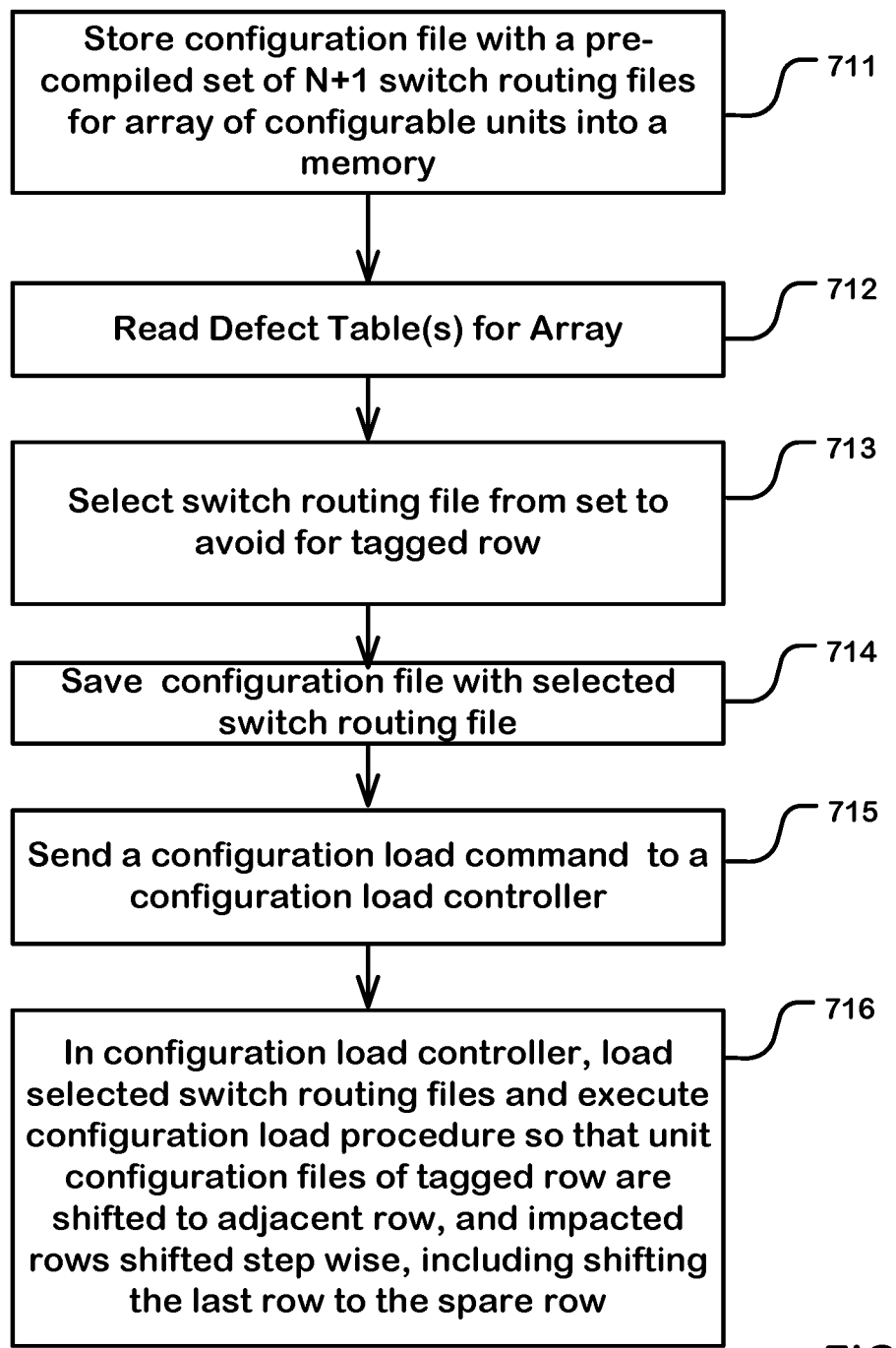
FIG. 7 is a flowchart of a procedure executed using a just-in-time compiler for a defect aware system like that of Fig. according to yet another embodiment.

FIG. 7 illustrates a procedure for a host system based on use of a configuration file including a routing data set. In this procedure, assuming an array including N+1 homogeneous sub-arrays, a configuration file for array of configurable units is stored in a memory, where the configuration file includes a pre-compiled routing data set, including N+1 switch routing files for respective tagged sub-arrays (711). The procedure reads the defect table, or other memory storing a parameter tagging an element, such as a row or other sub-array, of the array of configurable units as unusable (712). In response to the tagged sub-array, the procedure selects one of the N+1 switch routing files for use with the configuration file (713). The selected switch routing file configures the interconnect configurable units (i.e. switches) for shifting the unit configuration files of the tagged row (or other sub-array) to an adjacent row, and shifting impacted rows step-wise, including shifting the last row, if utilized in the default configuration, to the spare row (or homogeneous sub-array). Then, the configuration file with the selected switch routing file is saved in memory (714). The procedure then signals a runtime program to send a configuration load command to a configuration load controller for the array (715). In this embodiment, the configuration load controller can load the selected switch routing file in the interconnect configurable units before loading the functional configurable units to set up virtual coordinates for the functional configurable units. Then, the configuration load procedure can be executed in which the routing of the unit configuration files is coordinated by the selected switch routing file using the virtual coordinates to shift the unit configuration files of the tagged row (or other sub-array) to an adjacent row, and shift impacted rows step-wise, including shifting the last row, if utilized in the default configuration, to the spare row (or homogeneous sub-array) (716). Alternatively, the runtime procedure can update the placements prior to loading.

A technology is described by which the placements are updated, or both placements and routing information are updated, using circuits coupled to the array, such as a configuration controller having an interface on the bus system (array level bus) linking the interconnect configurable units in the array of configurable processors. Such circuits can implement changes in routing and placement in dependence on the tagged element of the array, without support of procedures, such as just-in-time compilation or configuration file selection, executed by a host processor, or in coordination with such procedures.

Figure 8:
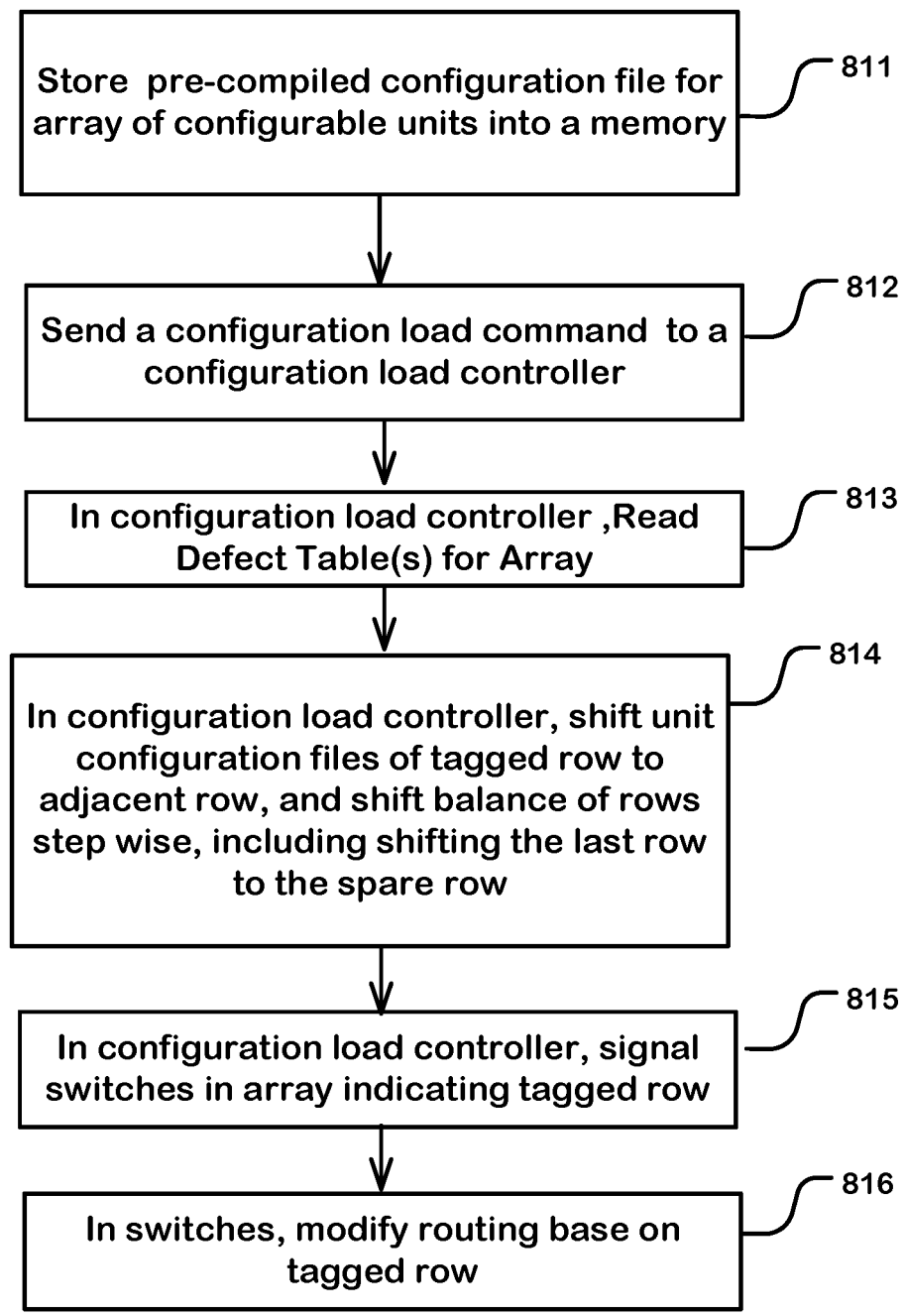
FIG. 8 is a flowchart of a procedure executing using an on-chip configuration controller for a defect aware system like that of Fig. according to yet another embodiment.

FIG. 8 is a flow chart for an embodiment executed by a configuration controller having an interface on the bus system (array level bus) linking the interconnect configurable units in the array of configurable processors. According to this procedure, a pre-compiled configuration file is stored in memory, configuring an array of configurable units to execute a data processing operation (811). A runtime program sends a configuration load command to the configuration load controller (812). In the configuration controller, a parameter identifying a tagged sub-array is received (or read) from a circuit that reads a parameter store and sets up a defect table (813). The configuration load controller loads the configuration file while shifting unit configuration files of a tagged row to an adjacent row, and shifting the balance of rows step-wise, including shifting the last row, if utilized, to the spare row (814). Also, the configuration load controller loads the interconnect configurable units, and transmits signals to the interconnect configurable units identifying the tagged row or the relative position of the tagged row (815). Finally, the switches or other interconnect configurable units modify the routing logic in dependence on the tagged row (816). This can be done by assigning virtual coordinates to the configurable units in dependence on their positions relative to the tagged row, and routing the communications using the virtual coordinates.

In one embodiment of the method of FIG. 8, the configuration controller assigns virtual addresses to configurable units in the array using the repair control signals. The interconnect configurable units can include registers storing the assigned virtual addresses, and storing physical addresses of the switches. Circuits can set the virtual addresses in the registers as a function of the repair control signals and the physical addresses. The addresses of the configurable units in the configuration file can be virtual addresses, set in a default mode for compilation of the configuration file, in which the virtual addresses are the same as the physical addresses. The virtual addresses are then applied in the loading of the configuration file, so that the loading can be performed using the virtual addresses in the configuration file and the virtual addresses stored in the interconnect configurable units. As a result the array is spatially configured using the virtual addresses, in dependence on the tagged sub-array.

Figure 9:
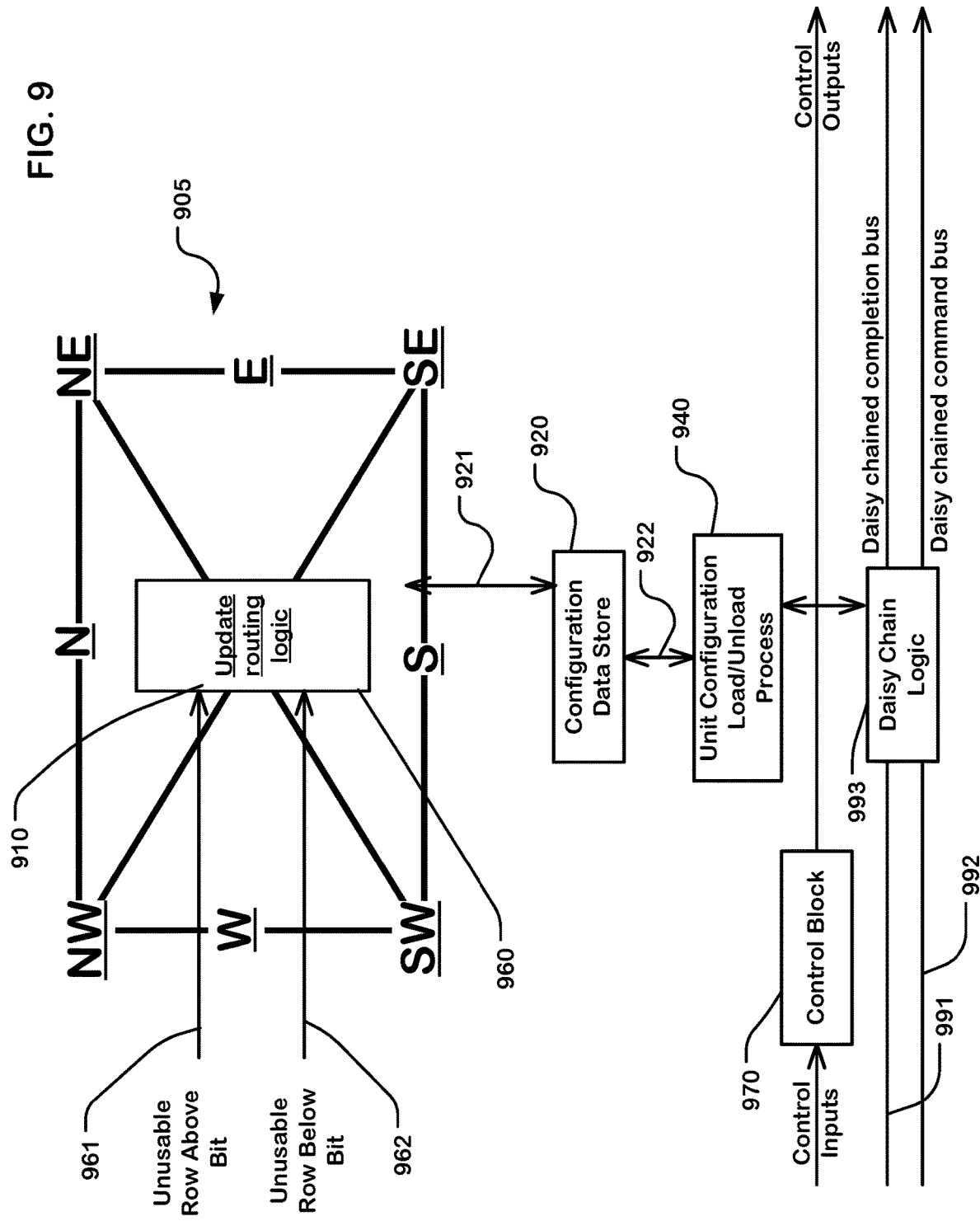
FIG. 9 is a block diagram illustrating an example of a configurable switch usable in an array of configurable units.

FIG. 9 is a block diagram illustrating an example configurable switch usable in an array of configurable units as described herein. The configurable switch includes circuitry 905 for arbitrating communications among vector, scalar and control buses in the array level network. In this embodiment, each switch includes circuitry 905 having eight ports, including North, South, East and West ports configured for connection to adjacent switches in the grid of switches. Also, the eight ports include Northeast, Southeast, Southwest and Northwest ports configured for connection to other types of configurable units, such as PCUs, PMUs, and AGCUs (which can include memory access controllers and configuration controllers as described herein).

In an embodiment, each switch includes logic circuits to update routing protocols in response to repair control signals indicating a location of an unusable element of the array, such as an unusable row. Each switch receives 2 repair control signals on global wires (961, 962) from the controller:

Bit 0 (Unusable row below bit on line 962) indicates when having one value (e.g. 1) that configurable units having the same row number as the switch are unusable. In this case, the switch stops processing any incoming transactions from the configurable unit on the same row as the switch. These transactions include vector, scalar, and control packets. Typically, these transactions come on the SE and SW interfaces of the switch. The switch on the spare, last row "N" will have this bit tied to 0.

Bit 1 (Unusable row above bit on line 961) indicates that configurable units on the row above the switch row are unusable. In this case, the switch should stop processing any incoming transactions from configurable units on the unusable row. These transactions include vector, scalar, and control packets. Typically, these transactions come on the NE and NW interfaces of the switch. The switch on the first row 0 will have this bit tied to 0.

These repair control signals indicate relative positions of the switches to the tagged configurable units or row of configurable units, and can be used in the routing logic 910 to implement a virtual addressing, by directing packets addressed to a physical row according to the shifted placement of unit configuration files in dependence on the tagged unusable row, rather than according to the physical location of the functional configurable units. In some embodiments, the switch logic does not block AGCU related traffic.

In some embodiments, including some just-in-time compiler supported embodiments, the switch does not need any specialized logic to handle outgoing packets to the unusable row because there should not be any packets being generated with the unusable row as destination. The graph should be compiled by the JIT compiler (or selected in the case of pre-compiled bit files for each unusable row) with the knowledge of unusable rows, so there cannot be any packets going to unusable rows. Likewise, the AGCU can be configured to ensure that no Program load and Argument load packets will be destined to unusable rows.

Configurable switches in the grid include configuration data stores 920 (e.g. serial chains) to store unit configuration files comprising a plurality of chunks (or sub-files of other sizes) of configuration data particular to the corresponding switch. The configuration data store 920 is connected to circuitry 905 via line 921. Also, the configurable switches in the grid each include a unit configuration load logic 940 connected to the configuration data store 920 via line 922. The unit configuration load logic 940 executes a unit configuration load process. The unit configuration load process includes receiving via the bus system (e.g. the vector inputs), chunks of a unit configuration file particular to the configurable switch, and loading the received chunks into the configuration data store 920 of the configurable switch.

The configuration data stores in the configurable switches in the grid in this example comprise serial chains of latches, where the latches store bits that control configuration of the resources in the switch. A serial chain in a configuration data store can include a first shift register chain for configuration data, such as port enable and disable parameters, and a second shift register chain for state information and counter values connected in series.

Each port in the configurable switch can interface with the scalar, vector and control buses using three corresponding sets of inputs and outputs. Also, the configurable switch can interface with the scalar, vector and control buses for communications directed to the switch, including for example for communications associated with configuration load and unload processes.

Each of the ports is coupled to routing logic 910, FIFO buffers and other resources to support packet-based and/or route-based communication in the grid of switches. The switch can include logic circuits to update the routing logic 910 (during or after configuration load) in response to the unusable row bits (961, 962) as described in more detail below.

In this embodiment, the configuration load and unload process uses a daisy-chained completion bus to indicate when a load/unload command to configure the configurable switches in the grid completes. As shown in the example of FIG. 9, a daisy-chained completion bus 991 and a daisy-chained command bus 992 are connected to daisy-chained logic 993. The daisy-chained logic 993 communicates with unit configuration load logic 940. The daisy-chained logic 993 can include load complete status logic as described below. Control inputs are received by control block 970, and control outputs are provided by the control block 970. Other topologies for the command and completion buses are possible but not described here.

Figure 10:
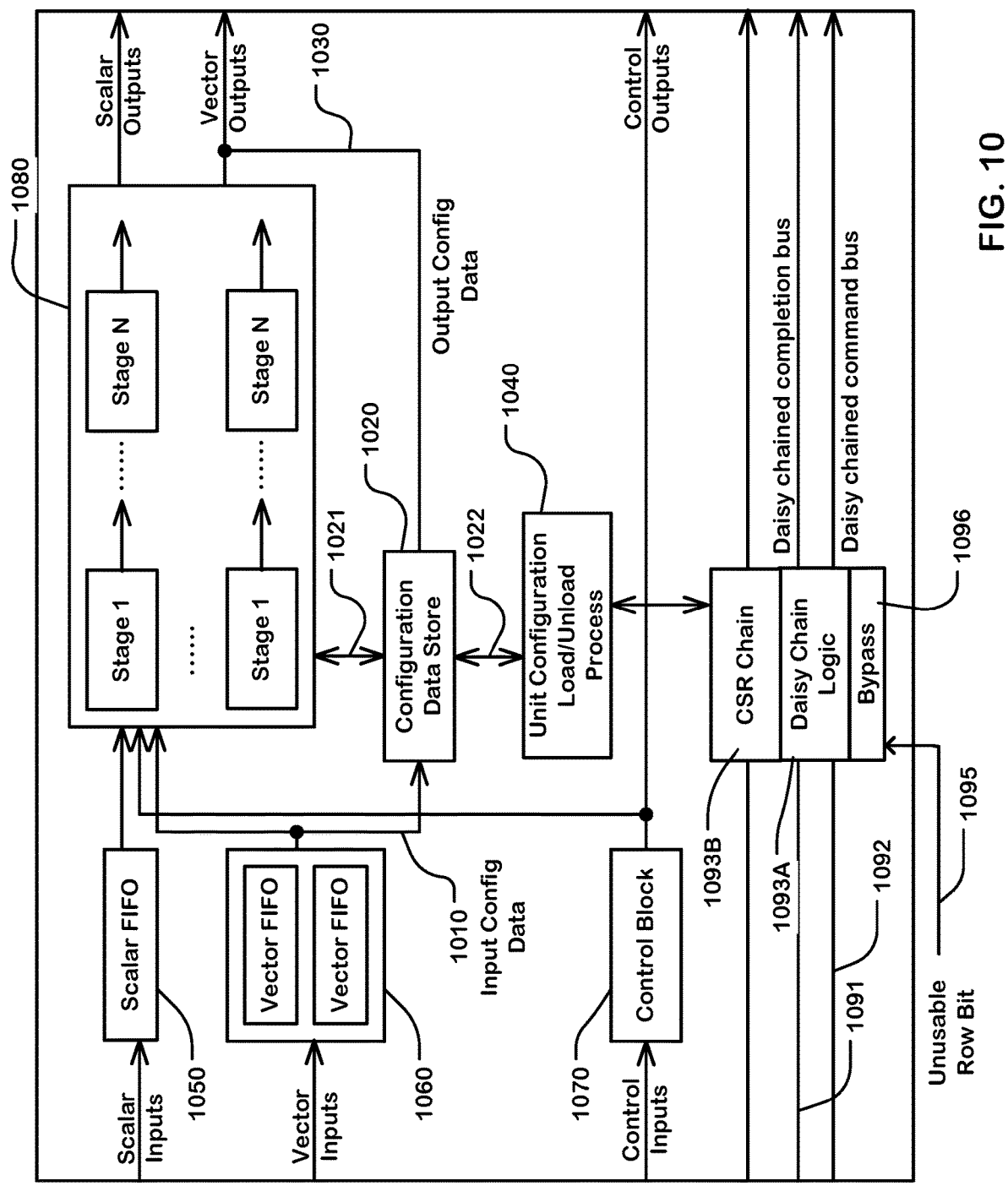
FIG. 10 is a block diagram illustrating an example configurable unit usable in an array of configurable units.

FIG. 10 is a block diagram illustrating an example configurable unit, such as a Pattern Compute Unit (PCU). Configurable units in the array of configurable units include configuration data stores 1020 (e.g. serial chains) to store unit configuration files comprising a plurality of chunks of configuration data particular to the corresponding configurable units. Configurable units in the array of configurable units each include unit configuration load logic 1040 connected to the configuration data store 1020 via line 1022, to execute a unit configuration load process. The unit configuration load process includes receiving via the bus system (e.g. the vector inputs), chunks of a unit configuration file particular to the configurable unit, and loading the received chunks into the configuration data store 1020 of the configurable unit. The unit configuration load process is further described in reference to FIG. 14.

The configuration data stores in configurable units in the plurality of configurable units in this example comprise serial chains of latches, where the latches store bits that control configuration of the resources in the configurable unit. A serial chain in a configuration data store can include a first shift register chain for configuration data and a second shift register chain for state information and counter values connected in series. A configuration store is further described below.

A configurable unit can interface with the scalar, vector, and control buses using three corresponding sets of inputs and outputs (IO): scalar inputs/outputs, vector inputs/outputs, and control inputs/outputs. Scalar IOs can be used to communicate single words of data (e.g. 32 bits). Vector IOs can be used to communicate chunks of data (e.g. 128 bits), in cases such as receiving configuration data in a unit configuration load process, and transmitting and receiving data during operation after configuration across a long pipeline between multiple PCUs. Control IOs can be used to communicate control signals such as the start or end of execution of a configurable unit. Control inputs are received by control block 1070, and control outputs are provided by the control block 1070.

Each vector input is buffered using a vector FIFO in a vector FIFO block 1060 which can include one or more vector FIFOs. Each scalar input is buffered using a scalar FIFO 1050. Using input FIFOs decouples timing between data producers and consumers, and simplifies inter-configurable-unit control logic by making it robust to input delay mismatches.

Input configuration data 1010 can be provided to a vector FIFO as vector inputs, and then be transferred to the configuration data store 1020. Output configuration data 1030 can be unloaded from the configuration data store 1020 using the vector outputs.

The CGRA uses a daisy-chained completion bus to indicate when a load/unload command has been completed. The master AGCU transmits the program load and unload commands to configurable units in the array of configurable units. As shown in the example of FIG. 10, a daisy-chained completion bus 1091 and a daisy-chained command bus 1092 are connected to daisy-chain logic 1093A, which communicates with the unit configuration load logic 1040. The daisy-chain logic 1093A can include program load status logic.

Also, the configurable units can include respective command and status registers CSRs (part of configuration data store in some embodiments) which are arranged in a CSR chain 1093B, linking CSR registers in adjacent configurable units, and providing a path for loading and unloading command and status data to the AGCU.

All configurable units other than the switches (PCUs and PMUs in this example) include bypass logic connected to receive a corresponding unusable row bit on line 1095 which indicates if the configurable unit is on an unusable row. This can be an untimed signal on a global wire. If this bit is SET, then the daisy-chain logic 1093A will do the following:

Bypass its program_load_done_in input to its program_load_done_out output on the daisy chained completion bus. Bypass its csr_ring_in input to its csr_ring_out output in the CSR chain.

The daisy-chained completion bus is further described below. Other topologies for the command and completion buses are possible but not described here.

A configurable unit includes multiple reconfigurable datapaths in block 1080. A datapath in a configurable unit can be organized as a multi-stage (Stage 1 . . . Stage N), reconfigurable SIMD (Single Instruction, Multiple Data) pipeline. The chunks of data pushed into the configuration serial chain in a configurable unit include configuration data for each stage of each datapath in the configurable unit. The configuration serial chain in the configuration data store 1020 is connected to the multiple datapaths in block 1080 via lines 1021.

A Pattern Memory Unit (e.g. PMU) on the daisy-chain completion bus and the CSR chain also includes bypass logic. A pattern memory unit can contain scratchpad memory coupled with a reconfigurable scalar datapath intended for address calculation, along with the bus interfaces used in the PCU. PMUs can be used to distribute on-chip memory throughout the array of reconfigurable units. In one embodiment, address calculation within the memory in the PMUs is performed on the PMU datapath, while the core computation is performed within the PCU.

A state machine can be used to control a unit configuration load process in a configurable unit. In general, a unit configuration load process receives a first chunk (or sub-file) of the unit configuration file particular to the configurable unit from the bus system in one bus cycle, begins pushing the received first chunk into the serial chain during subsequent shifter cycles which occur at the same rate as the bus cycles, before a second chunk of the unit configuration file is received. Upon receiving the second chunk of the unit configuration file particular to the configurable unit from the bus system in a later bus cycle, the process begins pushing the received second chunk into the serial chain during cycles after pushing earlier received chunks into the serial chain. In some or all rounds of the configuration load process, a first chunk can be consumed by the unit configuration load process in the configurable unit before the second chunk (next in the order of chunks of the unit configuration file) in the plurality of ordered chunks is received by the configurable unit.

A unit configuration file includes a plurality of chunks of configuration data for a corresponding configurable unit in a plurality of configurable units in an array of configurable units. The chunks of configuration data represent the initial configuration, or starting state, of respective configurable units. A configuration load operation in this system is the process of setting up the unit configuration files of configuration data in an array of configurable units to allow all the configurable units to execute a program.

In order to synchronize and communicate the completion of configuration load commands issued by the configuration load controller in a MAGCU, a single wire daisy-chained scheme is implemented in one example, supported by logic included in daisy-chain logic (e.g., daisy-chain logic 1093A in FIG. 10) in each component of the chain. This scheme requires every component to have the following 2 ports:
1. An input port called PGM_LD_DONE_IN
2. An output port called PGM_LD_DONE_OUT A component will drive its PGM_LD_DONE_OUT signal when it has completed executing the command issued by MAGCU and its PGM_LD_DONE_IN input is driven high. The MAGCU initiates the daisy-chain by driving its PGM_LD_DONE_OUT when it has completed all necessary steps for executing a command. The last component in the chain will drive its PGM_LD_DONE_OUT which is connected to the PGM_LD_DONE_IN of MAGCU. PGM_LD_DONE_IN of the MAGCU going high indicates the completion of a command. After delivering the data corresponding to all CHUNKS of all components, MAGCU drives its PGM_LD_DONE_OUT port high. All components will drive their respective PGM_LD_DONE_OUT ports high when they have completed loading all their configuration bits.

When MAGCUs input port PGM_LD_DONE_IN is asserted, the configuration file load is complete.

Figure 11:
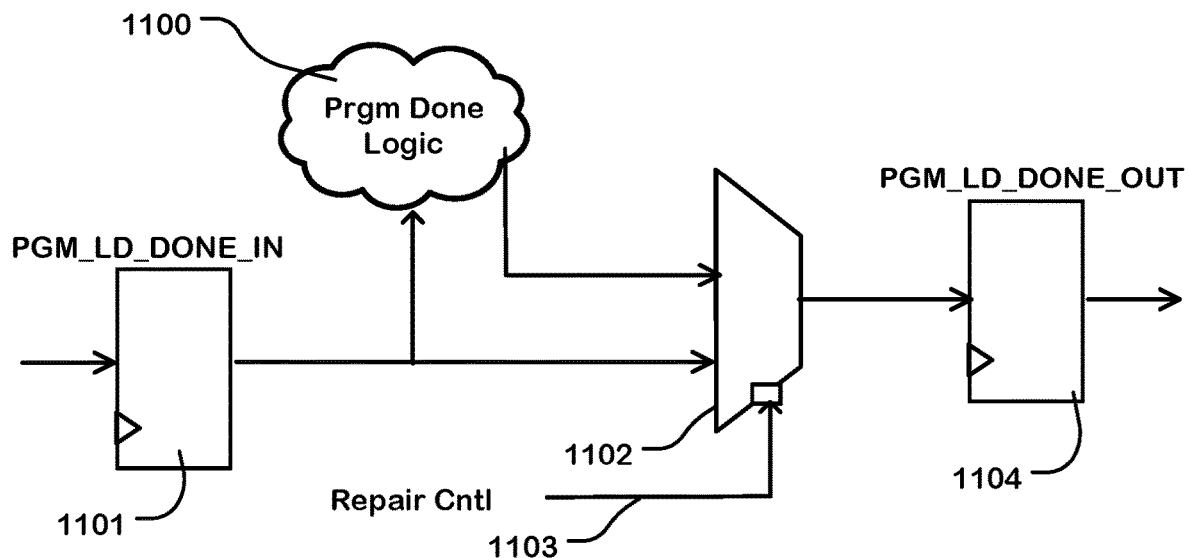
FIG. 11 is a diagram of bypass logic for a daisy-chained control network usable in an array of configurable units.

FIG. 11 is a diagram of a bypass circuit which can correspond with the bypass circuit 1096 of FIG. 10, for the program-load-done signal in the completion daisy chain in a local configurable unit. The completion daisy chain receives the PGM_LD_DONE_IN signal at register 1101, the output of which is connected to a selector 1102, and to program done logic circuits 1100 in the configurable unit. A second input to the selector 1102 is an output of the program done logic circuits 1100 which output a program-done signal indicating completion of loading of a unit configuration file for the local configurable unit. A repair control signal on a line 1103 (corresponding to line 1095 in FIG. 10) is applied as a control bit to the selector 1102. Output of the selector 1102 is applied to register 1104, which provides the PGM_LD_DONE_OUT signal. In the event that the configurable unit is disposed on an unusable row, then the PGM_LD_DONE_IN signal is selected and applied to register 1104, where it is passed forward as the PGM_LOAD_DONE_OUT signal.

Also, configuration status registers CSRs cannot be accessed as the logic is potentially unreliable and can cause unintended failures. In one embodiment, software should not issue any reads or writes to CSRs on Unusable rows. Hardware in AGCUs or associated configuration controllers will intercept CSR accesses to Unusable rows, drop CSR writes and return CSR read data with all 1's. A new maskable interrupt can be implemented in some embodiments and, if enabled, the interrupt will be triggered on CSR access to Unusable rows.

Figure 12:
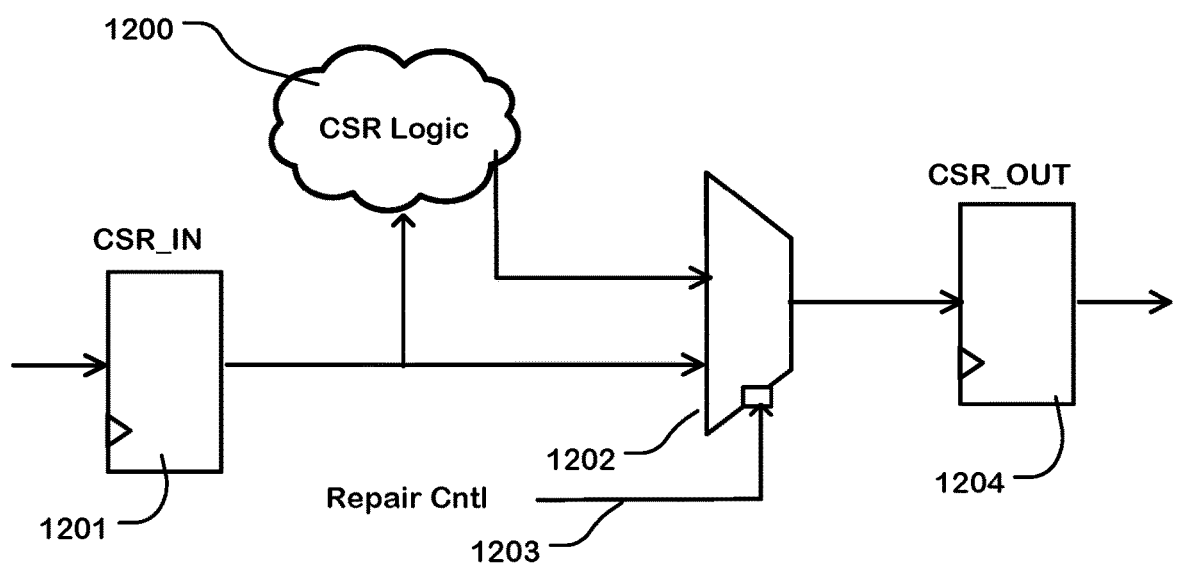
FIG. 12 is a diagram of bypass logic for a daisy-chained, control status register network usable in an array of configurable units.

FIG. 12 is a diagram of a bypass circuit which can correspond with the bypass circuit 1096 of FIG. 10 local to a particular configurable unit, for the CSR daisy chain in some embodiments. The CSR daisy chain receives the CSR_IN data at register 1201 from a CSR register for a previous configurable unit, the output of which is connected to a selector 1202, and to CSR circuits 1200 that reflect control status of the local configurable unit. A second input to the selector 1202 is an output of the CSR circuits that reflects control status of the local configurable unit. A repair control signal on a line 1203 (corresponding to line 1095 in FIG. 10) is applied as a control bit to the selector 1202, indicating whether the local configurable unit is unusable, such as in this embodiment disposed in an unusable row (or bad sub-array). Output of the selector 1202 is applied to register 1204, which provides the CSR_OUT data. In the event that the configurable unit is unusable, then the CSR_IN data selected and applied to register 1204, where it is passed forward as the CSR_OUT data.

In embodiments described herein, configuration control logic generates repair control signals in dependence on the tagged unusable element, or tagged unusable sub-array, and distributes them on signal lines which can be direct wires, or untimed signal lines that are static after reset, or otherwise separate from the bus system, connected to circuits in the configurable units in the array. The circuits in the configurable units are responsive to the respective repair control signals to adjust operations to accommodate a placement that does not use the tagged unusable elements or tagged unusable sub-array, including in different embodiments, bypassing daisy-chained signals from other configurable units and adjusting routing of communications among the configurable units.

Figure 13:
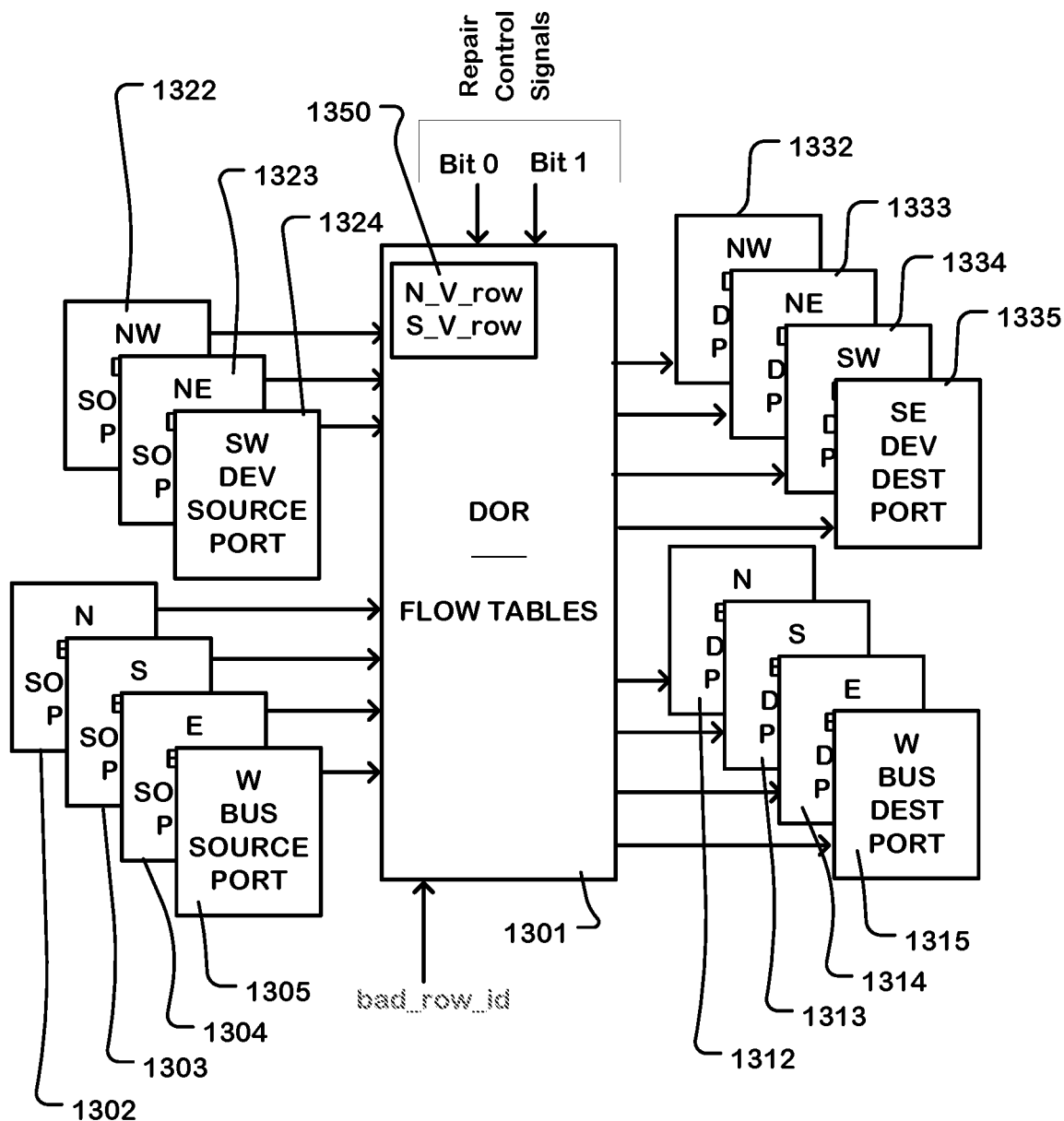
FIG. 13 is a simplified block diagram of switch routing circuits usable in an array of configurable units.

FIG. 13 is a functional block diagram of a switch, which is an example of an interconnect configurable unit suitable for use in an array like that of FIG. 3. In this example, the switch includes bus source ports 1302, 1303, 1304, 1305 which are connected to respective bus lines on the north, south, east and west sides of the switch. The switch includes device source ports 1322, 1323, 1324 which are connected to respective configurable functional units on the northwest, northeast and southwest sides of the switch. An additional device source port could also be included for connection to a reconfigurable functional unit on the southeast side of the switch in some embodiments. The bus source ports and device source ports can comprise FIFO buffers, arbitration logic and selectors which connect selected data on the respective ports to routing logic 1301, which determines the destination port for the selected data.

Also, the switch includes bus destination ports 1312, 1313, 1314, 1315 which are connected to respective bus lines on the north, south, east and west sides of the switch. The switch includes device destination ports 1332, 1333, 1334, 1335 which are connected to respective configurable functional units on the northwest, northeast, southwest and southeast sides of the switch. The bus destination ports and device destination ports can include input selectors and arbitration logic controlled by the routing logic 1301, which provide selected data to output buffers in the respective destination ports.

In this example, each switch receives repair control signals, which are static during execution of a data processing operation in some embodiments, including 2 bits:

Bit 0, in one example, indicates that functional configurable units on the same row as the switch are unusable. In this case, the switch should stop processing any incoming transactions from functional configurable units on the same row as the switch, physically "south" of the switch, for example. These transactions include vector, scalar, and control packets. Typically, these transactions come on the SE and SW interfaces of the switch. The switch on the spare row can have this bit tied to 0.

Bit 1, in this example, indicates that functional configurable units on the row above the switch row are unusable, physically "north" of the switch, for example. In this case, the switch should stop processing any incoming transactions from functional configurable units on the unusable row. These transactions include vector, scalar, and control packets. Typically, these transactions come on the NE and NW interfaces of the switch. A switch on row 0 can have this bit tied to 0.

Bit 0 and Bit 1 can be delivered on global wires, which are untimed and static after reset, from the defect-aware configuration controller at the AGCU for the tile.

Routing logic 1301 can include additional circuits that operate in dependence on the tagged row, in this example. In the illustrated example, the routing logic 1301 includes a register 1350 which stores a north virtual row number N_V_row for the row of functional configurable units above the switch usable for NE, NW, N, E and W ports, and a south virtual row number S_V_row for the row of functional configurable units below the switch usable for SE, SW and S ports, which are generated dependence on repair control signals such as a "bad_row_id" signal provided by the configuration controller for the tile, or otherwise provided in the configuration repair process. In examples described below, if the tagged row is physically "south" of the switch, then the N_V_row number is the same as the physical row. If the tagged row is physically "north" of the switch, and unit configuration files are shifted downward, then the N_V_row number is equal to (the physical row number−1).

The virtual row numbers are virtual addresses assigned by the configuration logic that generates the repair control signals. The switches can include circuits that compute the virtual addresses using the repair control signals, and the physical row numbers of the switches, or of configurable units adjacent to the switches (e.g. to the North and South of the switch row).

The routing logic 1301 includes routing data in the switch according to communication protocols utilized in the interconnect bus system. In an example technology, more than one communication protocol can be implemented. For example, one communication protocol can comprise dimension-order routing DOR for point-to-point flows. A second communication protocol suitable for point-to-point and broadcast flows can comprise flow-based routing which utilizes configurable flow tables in the routing logic 1301.

For dimension-order routing, a data packet received at the switch identifies coordinates (e.g. row and column number) of the destination functional configurable unit. Routing logic 1301 routes the packets to the destination by comparing the destination row and column to the location of the current switch. Packets can then be routed vertically first from the source row to the destination row, and then horizontally from the source column to the destination column. This dimension-order routing can be implemented without requiring additional configuration data. In embodiments of the technology described herein, the dimension-order routing can utilize upper and lower virtual row numbers (N_V_row and S_V_row) to select destination ports in the switch on which to forward the packets.

For flow-based routing, the configuration file assigns flow numbers to the destination field of packets to be distributed among functional configurable units in the array. Routing logic 1301 includes routing tables which are set up by configuration data, such as unit configuration files for the switch, and uses the routing tables to select destination ports in the switch on which to forward the packets. In some embodiments, circuits in the routing logic 1301 can update the routing tables in dependence on the tagged row according to circuit-implemented rules to bypass the tagged row, while preserving interconnections required for execution of the graph.

Figure 14A:
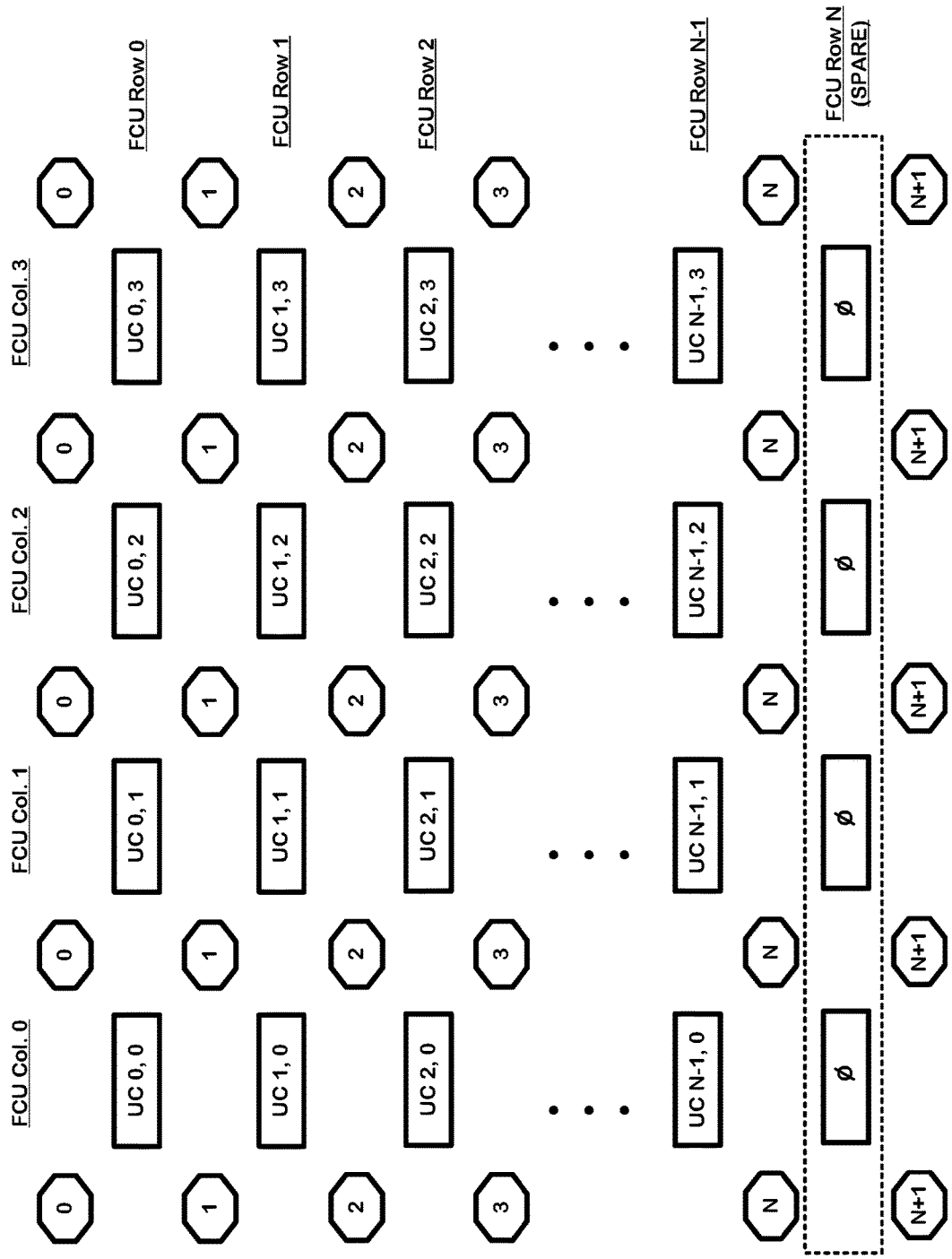
FIGS. 14A and 14B illustrate placement of unit configuration files from an initial or pre-compiled configuration file for a tile, and shifting of the placement in dependence on a tagged unusable row.

FIG. 14A illustrates a physical geometry of a tile. In the figure, octagonal shapes represent switches (interconnect configurable units), on the bus system for the array. The rectangular units represent functional configurable units. In the example of FIG. 14A, the array includes functional configurable unit FCU rows 0 to N, where the last row, row N, is a spare row on the tile (N+1 total rows). In this example, the homogeneous sub-arrays of the tile consist of rows of functional configurable units. In other embodiments, there could be a spare column, in which the columns are homogeneous sub-arrays. In yet other embodiments, the homogeneous sub-arrays can have other geometries.

An initial configuration file for the tile utilizes at most N rows, excluding FCU row N. In FIG. 14A, each of the functional configurable units is labeled indicating a placement of a unit configuration file. Thus, the FCU in row zero, column zero for the initial configuration file is configured using a unit configuration file UC 0,0 having the spatial coordinates 0, 0. The FCU in row zero, column one for the initial configuration file is configured using a unit configuration file UC 0,1 having the spatial coordinates 0, 1. The spatial coordinates for the unit configuration files in the initial configuration file match the physical coordinates of the corresponding functional configuration units throughout the tile. The functional configuration units in the spare row are not configured with elements of the graph in the initial configuration file as represented by the null symbol.

In the event of a tagged row, the system executes a procedure to load configuration data to the spatially reconfigurable array of processors to implement an executable graph using a subset of the plurality of rows of processors excluding the tagged row in dependence on the data in the parameter store. One example of the spatial arrangement of the configuration unit files having the initial configuration shown in FIG. 14A is illustrated in FIG. 14B.

In some embodiments, a configuration controller on the same chip as the tile executes a procedure to load configuration data to the spatially reconfigurable array of processors to implement an executable graph using a subset of the set of homogeneous sub-arrays excluding the tagged unusable homogeneous sub-array in dependence on the data in the parameter store. This procedure for implementing the graph in response to the indicated unusable homogeneous sub-array, can include shifting placement of unit configuration files to a spare row in the N+1 rows (or other sub-array).

Figure 14B:
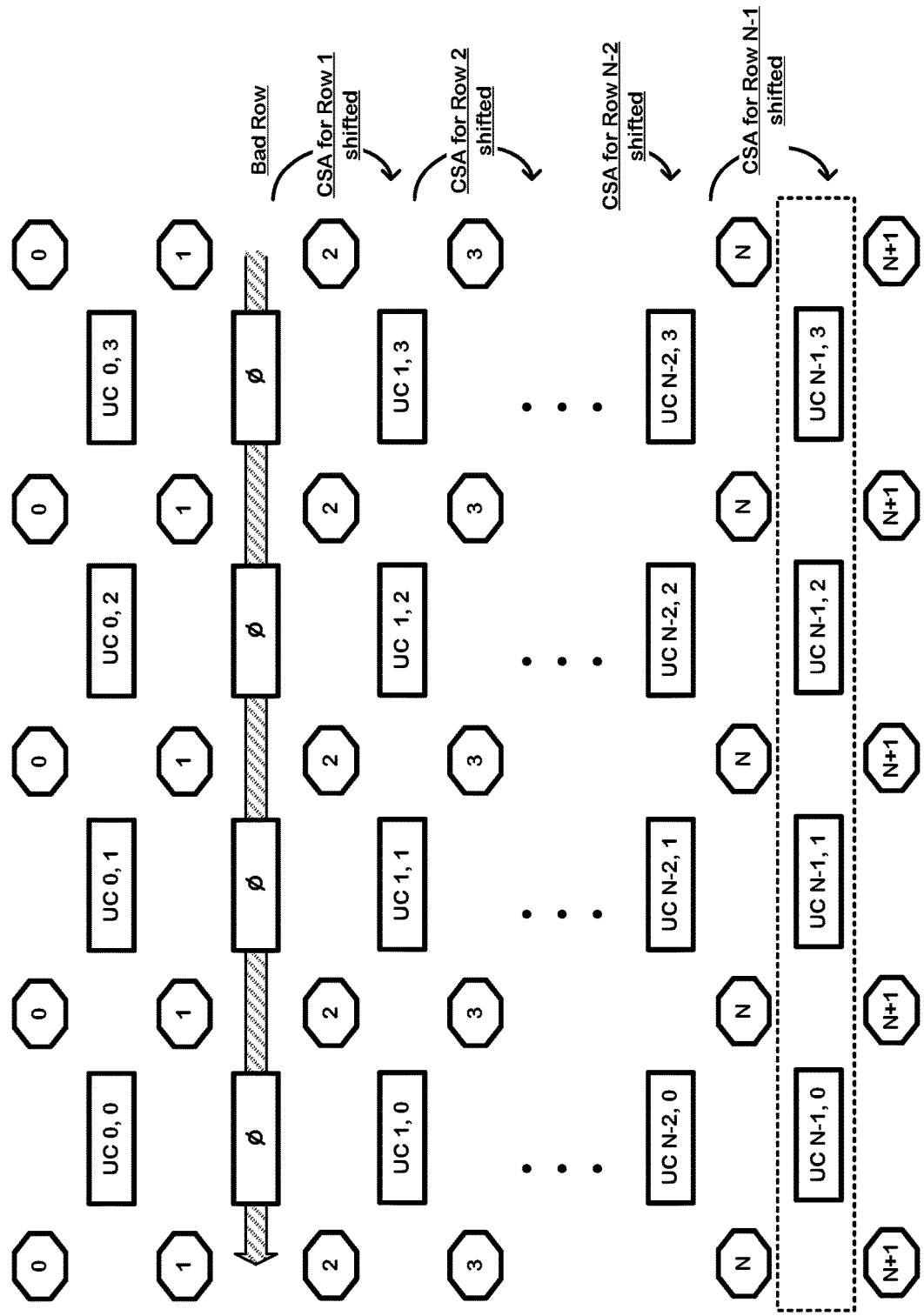

FIG. 14B is labeled in the same manner as FIG. 14A, and shows a shifted configuration applied in dependence on the tagged sub-array. Thus, a case wherein the tagged homogeneous sub-array is sub-array SA(X), where X is physical row index 1 in this embodiment (between switch rows 1 and 2), and can be any physical row in the order SA(i) for index "i" between 0 and N, the configuration controller loads configuration data which uses sub-array configuration data block CSA(0) including the unit configuration files for the row (UC 0,0 to UC 0,3) for virtual row i=0, to configure sub-array SA(0) physical row index i=0 (i.e. when X is greater than i). The sub-array configuration blocks for the rest of the graph are shifted by one sub-array, or one row in this example. Thus, for X=1, the sub-array configuration data block CSA(1) (UC 1,0 to UC 1,3) is placed in sub-array SA(2), and so on, so that when the tagged row X is less than the physical row index "i", the sub-array configuration block having virtual placement at row "i" is placed in physical row "i+1".

Thus, where the homogeneous sub-arrays are rows, the configuration controller loads configuration data so that rows on one side of the tagged row (X is greater than i) are loaded with placements of configuration data blocks unchanged from the initial configuration data, the tagged row X is skipped, and the configuration data block placed in row X according to the initial configuration data is shifted to the next adjacent row (row i+1), and the configuration data blocks for the rest of the rows (X is less than i) according to the initial configuration data are shifted toward the spare row by one row.

As a result, in cases in which the last row according to the placement in the initial configuration data is row N−1, then the unit configuration files initially placed in row N−1 (UC N−1, 0 to UC N−1, 3) are shifted to the spare row N.

As illustrated in FIGS. 14A-14B, the tile includes N+1 homogeneous sub-arrays spatially arranged in order SA(i), where "i" is a physical row index going from 0 to N, and the configuration data includes initial configuration data for a target array arrangement having at most N homogeneous sub-arrays, so that the spare sub-array is not utilized. The initial configuration data includes placements for configuration sub-arrays CSA(j), where "j" is a virtual row index going between 0 to K−1, where K is equal to or less than N, and includes unit configuration files to configure the configurable units in respective homogeneous sub-arrays as assigned in the initial configuration file. In the case in which no row is tagged unusable, the virtual row index j is equal to physical row index i.

This approach to shifting the unit configuration files for a configuration sub-array to an adjacent physical sub-array preserves adjacency of the functions of the configurable units in which the unit configuration files are initially placed, with the exception of the tagged sub-array. In this manner, communication latencies are not impacted for most of the graph, and impacted minimally for routes across the tagged sub-array.

In an alternative approach, the procedure for shifting the unit configuration files can be executed by a just-in-time compiler in a host processor which generates an updated configuration file implementing the placement in dependence on the tagged sub-array, or otherwise be supported by a runtime processor which divides the processes for changing the placements of the unit configuration files with a configuration controller coupled to the array, as described above.

Generally, a method for operating a system comprising a spatially reconfigurable array of processors can utilize virtual coordinates. The processors in the array of processors have physical coordinates in the array and a configurable bus system connected to the processors in the array of processors. The method using virtual coordinates can comprise accessing a parameter store storing data indicating a unusable processor in the array, assigning virtual coordinates to the processors in the array, excluding the unusable processor, in dependence on the data in the parameter store, and configuring a configurable bus system to route data during operation of the data processing operation, among the processors in the array using the virtual coordinates. Also, the bus system is configured using virtual coordinates which can be used to route configuration data in dependence on the tagged unusable processor or processors.

Figure 15A:
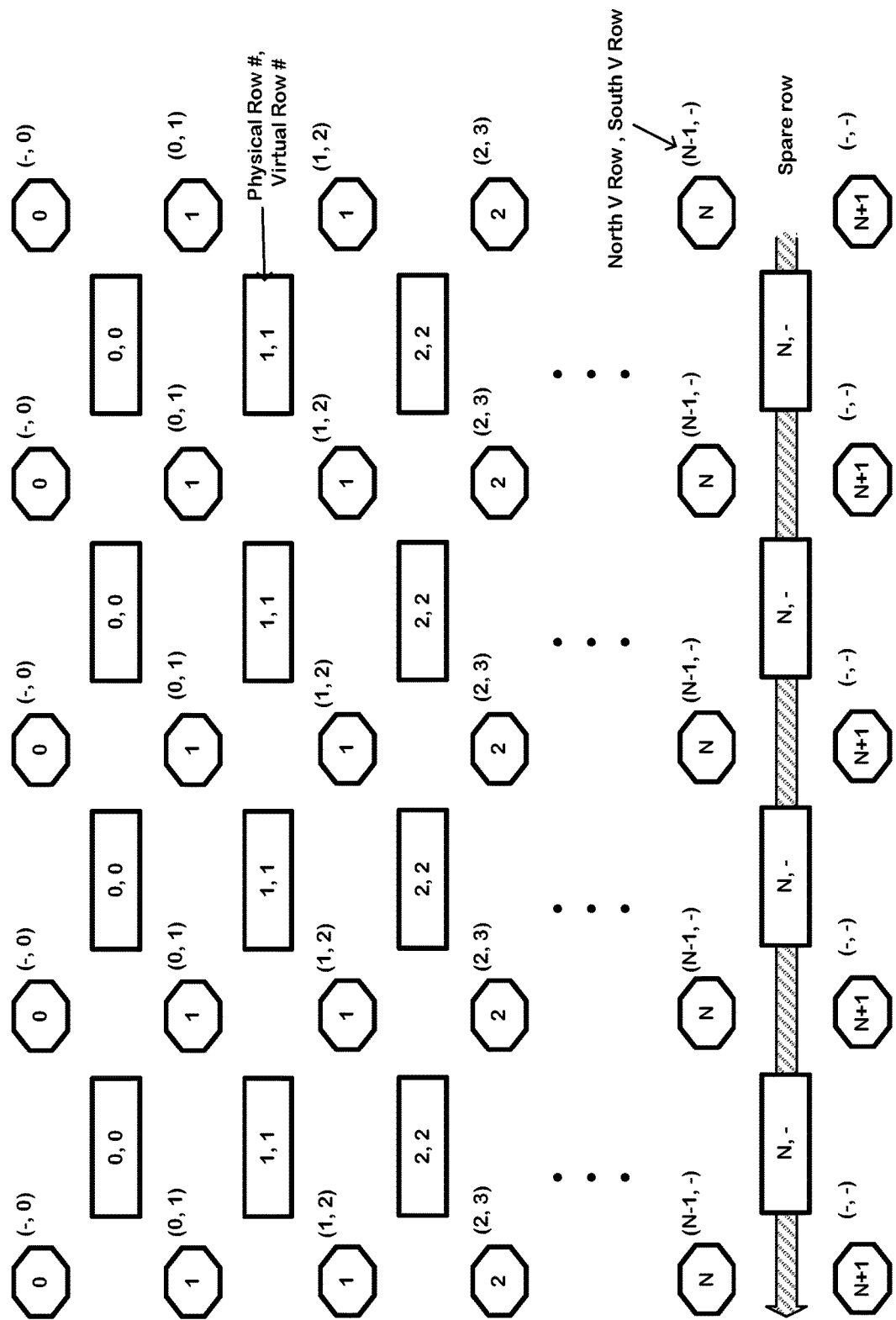
FIGS. 15A to 15C illustrate defect aware adjustments of dimension-order routing in dependence on a tagged unusable row.
Figure 15B:
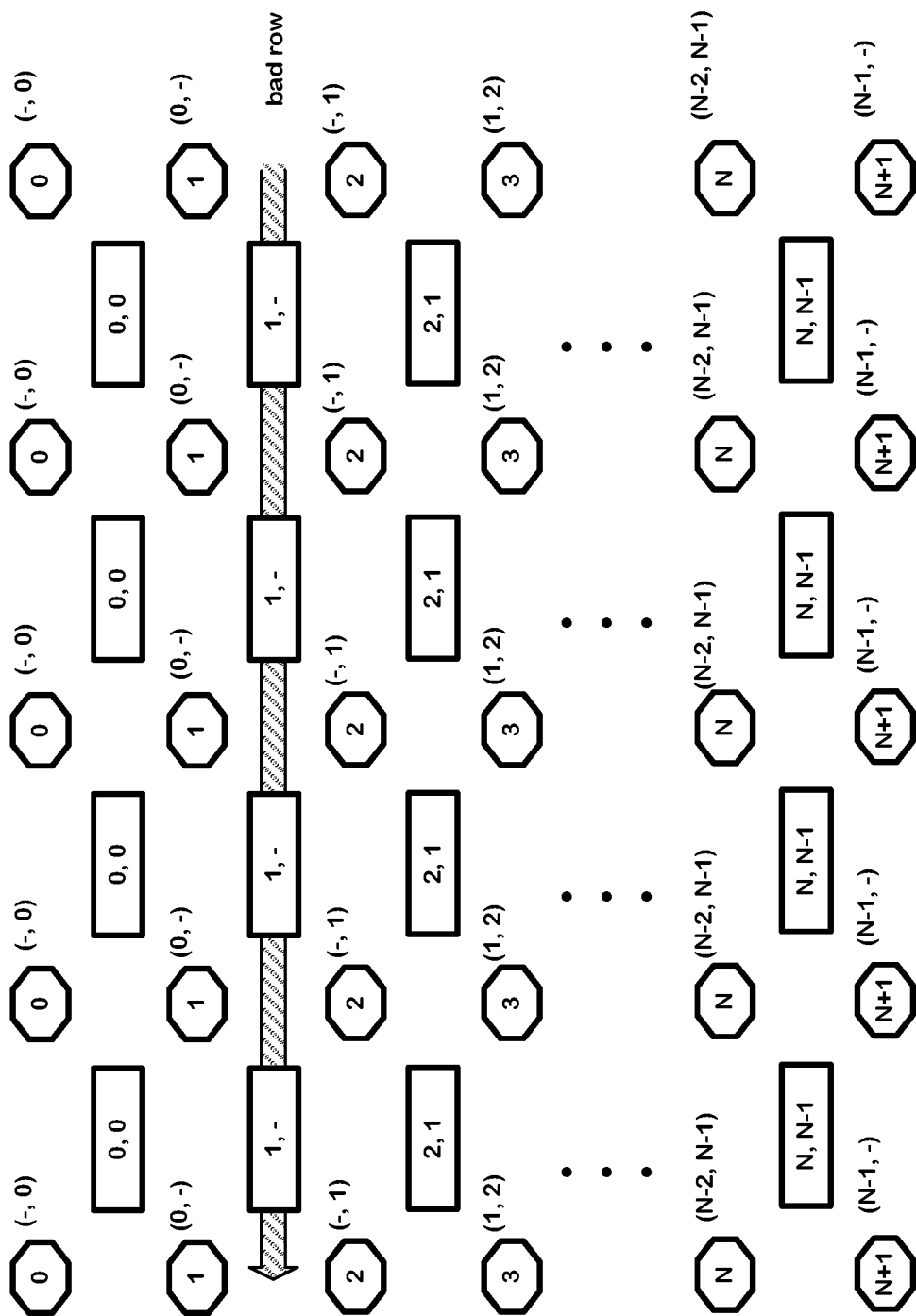
Figure 15C:
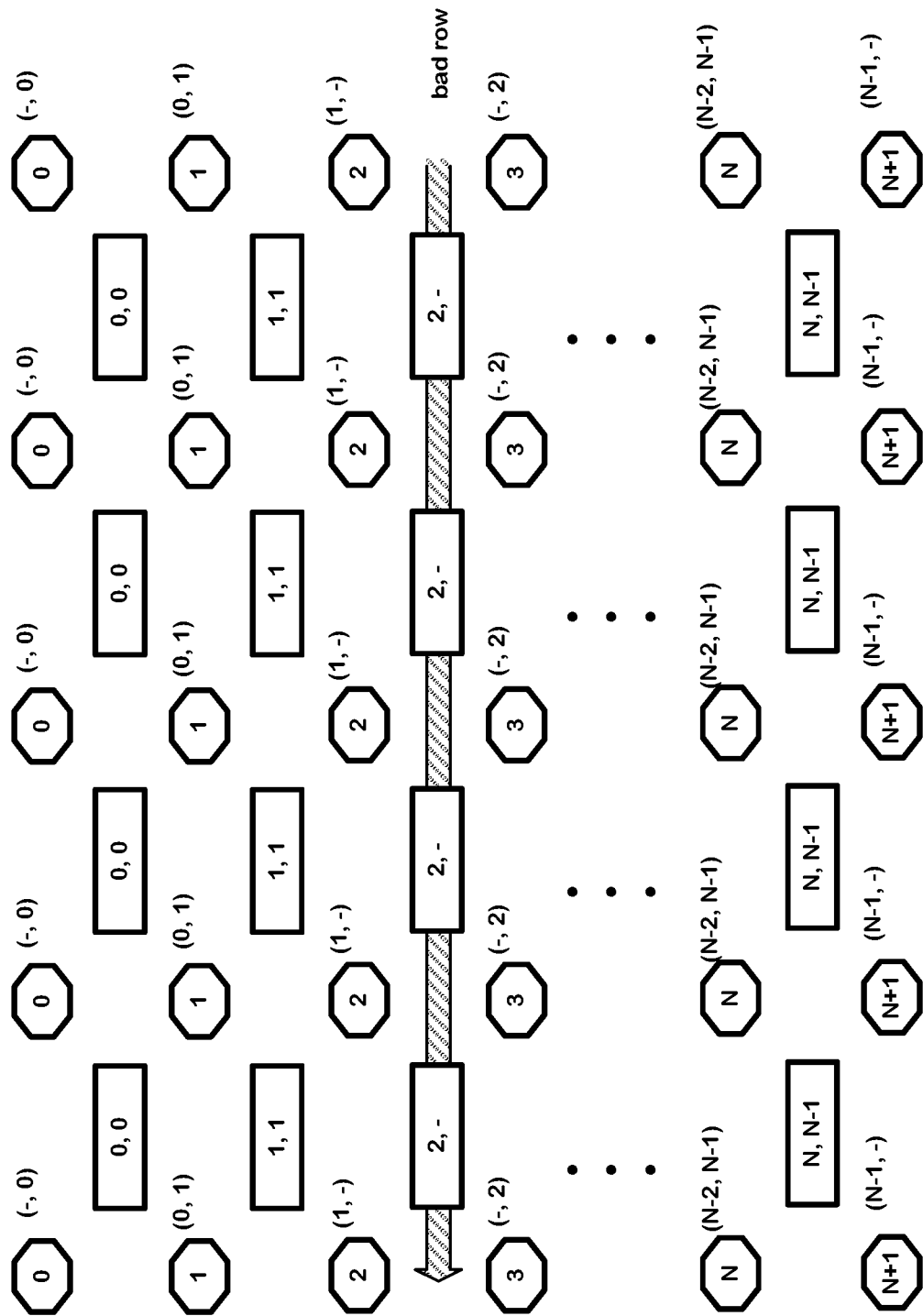

FIGS. 15A to 15C illustrate rules based on assigning virtual row IDs in dependence on the tagged row which can be implemented by routing logic in the interconnect configurable units. In one embodiment, each switch includes a register identifying its physical row, corresponding to the row of functional configurable units on its south side, and internal logic circuits responsive to repair control signals (a bad functional configurable unit row ID) generated during a power-on reset or other times in dependence on a tagged row identified by a parameter in, for example, an eFuse store. The internal logic circuits generate two virtual row IDs, one for the north side row governing the NE, NW, N, E and W ports on the switch, and one for the south side row governing the SE, SW and S ports on the switch. The virtual row IDs can be utilized to execute routing in dependence on the tagged row.

Also, the virtual row IDs can be used by the configuration controller to load the unit configuration files according to a placement in dependence on the tagged row, as described above. In other embodiments, the virtual row ID logic can be utilized by a runtime program to reassign placements of the unit configuration files in dependence on the tagged row as discussed above.

In FIG. 15A, the switches are represented by octagons labeled with their physical row number and parenthetical indications of the North virtual row (virtual row number connected to NE and NW switch ports) and South virtual row (virtual row number connected to SE and SW switch ports) are shown to the right of the corresponding switch octagon. The functional configurable units are represented by rectangles labeled with the physical row number and virtual row number of the rows in which they are disposed.

In the illustration of FIG. 15A, the tile includes N+1 physical rows SA(i), for i going from 0 to N. The spare row is row N in this example. When no row is tagged as unusable, the physical row number and virtual row number for each of the unit configuration files are the same. The spare row, row N, does not have a virtual row number. Also, the North virtual row and South virtual row on each of the switches matches the physical row number on the north and south sides of the switch, respectively. In switch row N, the South virtual row is a null value, because switch row N of the tile is the default unused sub-array. Also in switch row N+1, there are no valid North and South virtual rows, because it is unused in this example.

FIG. 15B illustrates the assignment of virtual row numbers in the case that physical row 1 is a tagged row. In this case, the physical row number and the virtual row number for each of the unit configuration files in rows (only row 0 in this example) above physical row 1 are the same. For all rows below physical row 1, the virtual row number is one less than the physical row number. In the physical row N, the virtual row number is N−1. The bad row, physical row 1, does not have a valid virtual row number.

Also, as illustrated in FIG. 15B, the switch row above the bad physical row 1 has a valid North virtual row number equal to the virtual row number of physical row 0, and does not have a valid South virtual row number. Likewise the switch row 2 below the bad physical row 1 does not have a valid North virtual row number, and has a South virtual row number equal to the virtual row number (1) of physical row 2. Switch rows below switch row 2 have North and South virtual row numbers that match the virtual row numbers of the physical rows of functional configurable units above and below the switch row. In the last switch row (switch row N+1), the North virtual row number is virtual row number N−1, and there is no valid South virtual row number.

FIG. 15C illustrates the assignment of virtual row numbers in the case that physical row 2 is a tagged row. In this case, the physical row number and the virtual row number for each of the unit configuration files in rows (rows 0 and 1 in this example) above physical row 2 are the same. For all rows below physical row 2, the virtual row number is one less than the physical row number. In the physical row N, the virtual row number is N−1. The bad row, physical row 2, does not have a valid virtual row number.

Also, as illustrated in FIG. 15C, the switch row above the bad physical row 2 has a valid North virtual row number equal to the virtual row number of physical row 1, and does not have a valid South virtual row number. Likewise, the switch row 3 below the bad physical row 2 does not have a valid North virtual row number, and has a South virtual row number equal to the virtual row number (2) of physical row 3. Switch rows below switch row 3 have North and South virtual row numbers that match the virtual row numbers of the physical rows of functional configurable units above and below the switch row. In the last switch row (switch row N+1), the North virtual row number is virtual row number N−1, and there is no valid South virtual row number.

Figure 16:
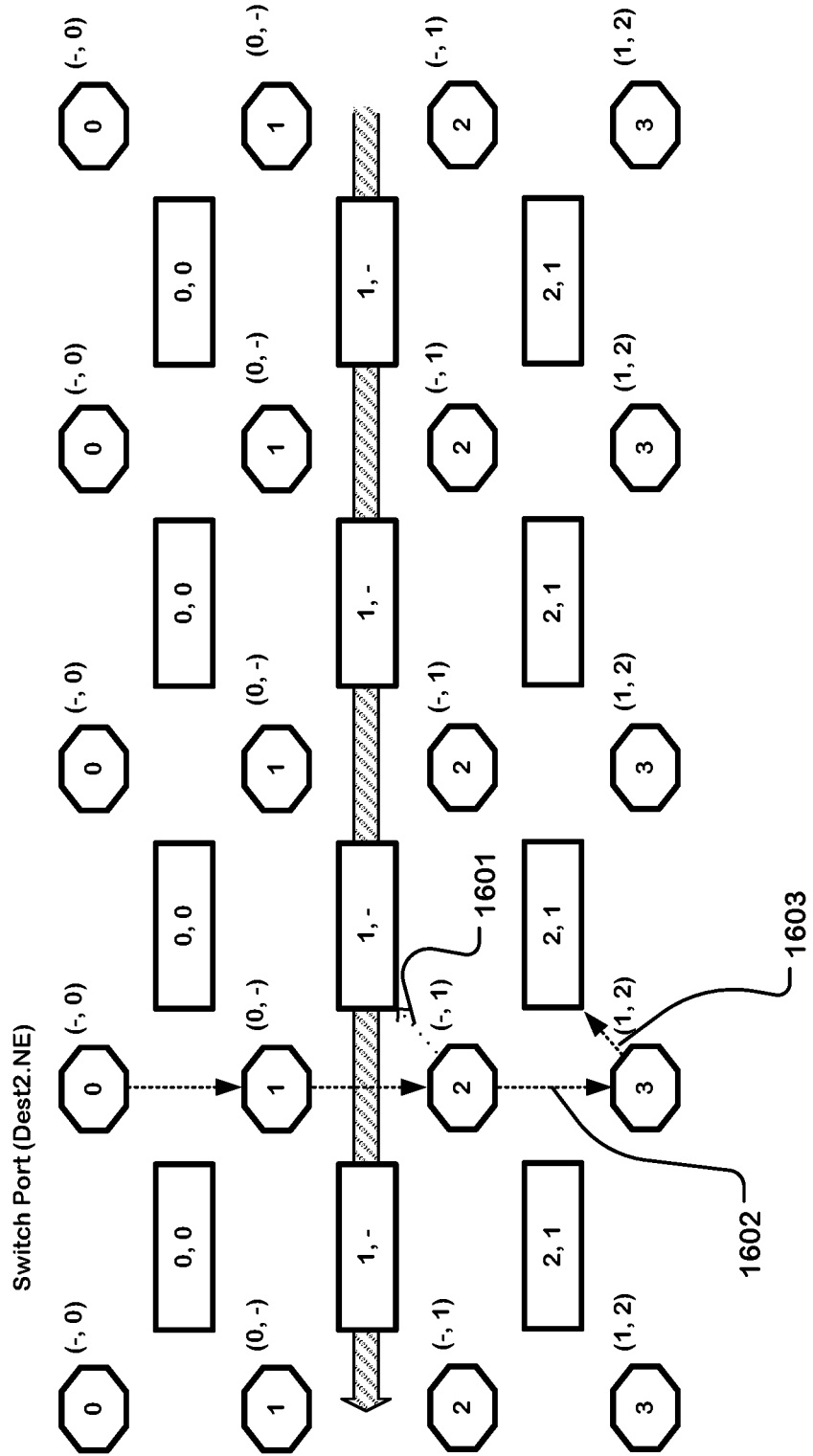
FIG. 16 illustrates defect aware adjustment of a route according to dimension-order routing.

FIG. 16 illustrates an example of dimension-order routing modified according to the virtual row numbers, in dependence on the identification of the tagged row. In this example, a packet is received at a source port at the switch in row 0, column 1 having a destination at switch port (Dest2.NE) (assuming the same column) indicating the northeast port of switch in switch virtual row 2 in column 1 (destined to the southeast port of the functional configurable unit in physical row 1). According to dimension-order routing, the packet is routed from the South port of the switch in row 0 to the North port of the switch in row 1. From there, the packet is routed to the South port of the switch in row 1 and to the North port of the switch in row 2. According to the initial configuration, the packet would be routed from the northeast port of the switch in physical row 2 (line 1601). However, the northeast port is blocked because there is no valid North virtual row. Instead, the routing logic in the switch in switch row 2 routes the packet to the South port. From there it is received on line 1602 at the North port of the switch in row 3. The switch in row 3 routes the packet on the northeast port on line 1603 to the functional configurable unit in physical row 2 having virtual row ID 1. This can be accomplished using circuits in the switch which compare the virtual row ID of the destination (Dest2 in this example) with the virtual row ID of the switch, as the packet appears at the switch. As a result, the packet is routed to the South bus port since the virtual destination row number is greater than the current switch virtual destination row (specifically the North virtual row since the packet's destination is a NE port.

Figure 17:
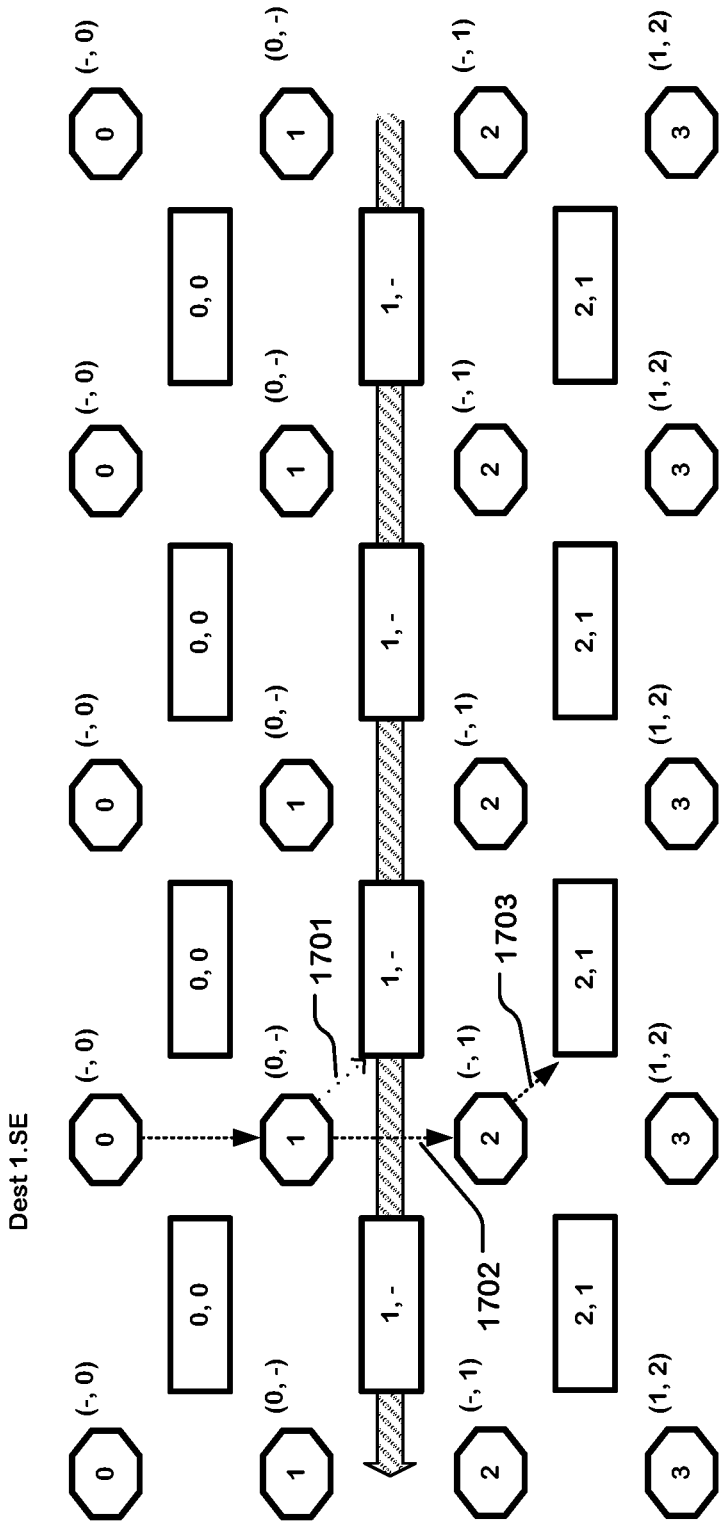
FIG. 17 illustrates defect aware adjustment of another route according to dimension-order routing.

FIG. 17 illustrates another example of dimension-order routing modified according to the virtual row numbers, in dependence on the identification of the tagged row. In this example, a packet is received at a source port at the switch in row 0, column 1 having a destination a switch port (Dest1.SE) indicating the southeast port of the switch in switch row 1 (assuming the same column) According to dimension-order routing, the packet is routed from the South port of the switch in row 0 to the North port of the switch in row 1. According to the initial configuration, the packet would be routed from the southeast port of the switch in row 1 (line 1701). However, the southeast port is blocked because there is no valid south virtual row. Instead, the routing logic in the switch in the switch in physical row 1 routes the packet to the South port. From there it is received on line 1702 at the North port of the switch in row 2. The switch in row 2 routes the packet on the southeast port on line 1703 to the functional configurable unit having virtual row ID 1.

Based on the North upper virtual row and South lower virtual row parameters, a switch can be considered to include two virtual devices for the purposes of configuration of the routing logic, either by software adjusting the configuration file for the tile, or by logic circuitry in the tiles (such as at the AGCUs) or in the switches, which responds to repair control signals. Each of the virtual devices includes a virtual row identifier; the virtual device on the north includes the upper virtual row identifier and the virtual device on the south includes the lower virtual row identifier. In switches above the bad row, the North virtual row, the South virtual row and the physical row are equal for the two virtual devices in the switch. Switches immediately above (adjacent) the bad row (SE and SW ports connected to configurable units in the bad row) have an upper virtual row that is equal to the switch physical row, and a lower virtual row which is undefined. Switches in the row immediately below (adjacent) the bad row (NE and NW ports connected to configurable units in the bad row) have an upper virtual row which is undefined, and a lower virtual row which is equal to the switch (physical row−1) which matches the physical switch row above the bad row. The other switches below the bad row all have shifted upper virtual row and lower virtual row numbers equal to their respective switch (physical row−1). This results in a "jumper row" by which the routing logic jumps over the bad physical row of functional configurable units, and logically merges two rows of switches. Once the switches configure the upper and lower virtual row identifiers, dimension-order routing is operable according to the parameters set in the initial configuration file.

In one embodiment, in a configuration load process, the defect-aware configuration controller can first configure the interconnect configurable units, such as the switches, to set up the upper and lower virtual row identifiers. Then, dimension-order routing in dependence on the virtual row identifiers can be utilized to load the unit configuration files to establish a placement in dependence on the location of the bad row. This procedure can be executed by logic, including circuitry at the defect-aware configuration controller which generates repair control signals, without requiring a runtime software process executed on a host system to modify the initial configuration file.

Figure 18:
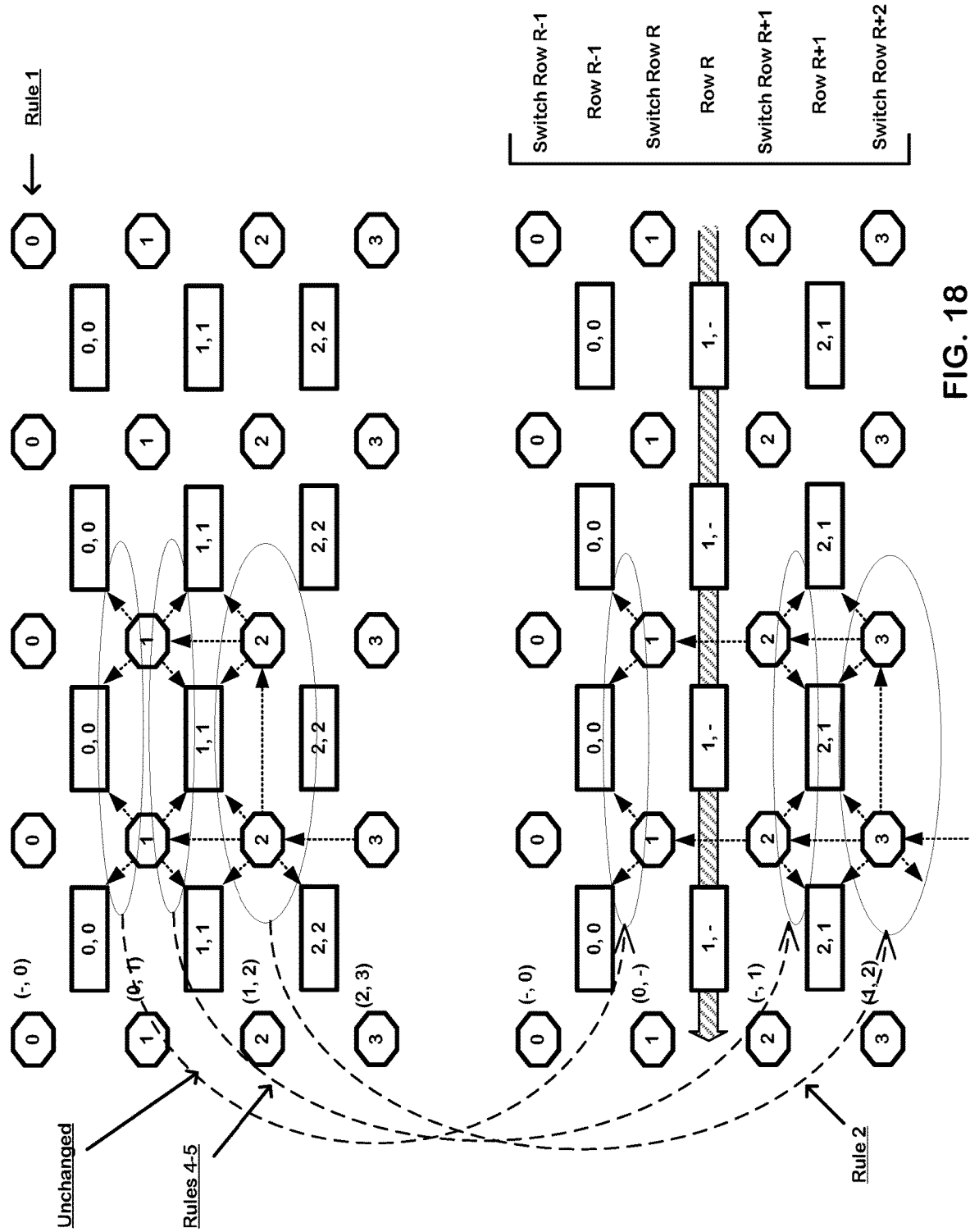
FIG. 18 illustrates an example of defect aware adjustment of flow routing.
Figure 19:
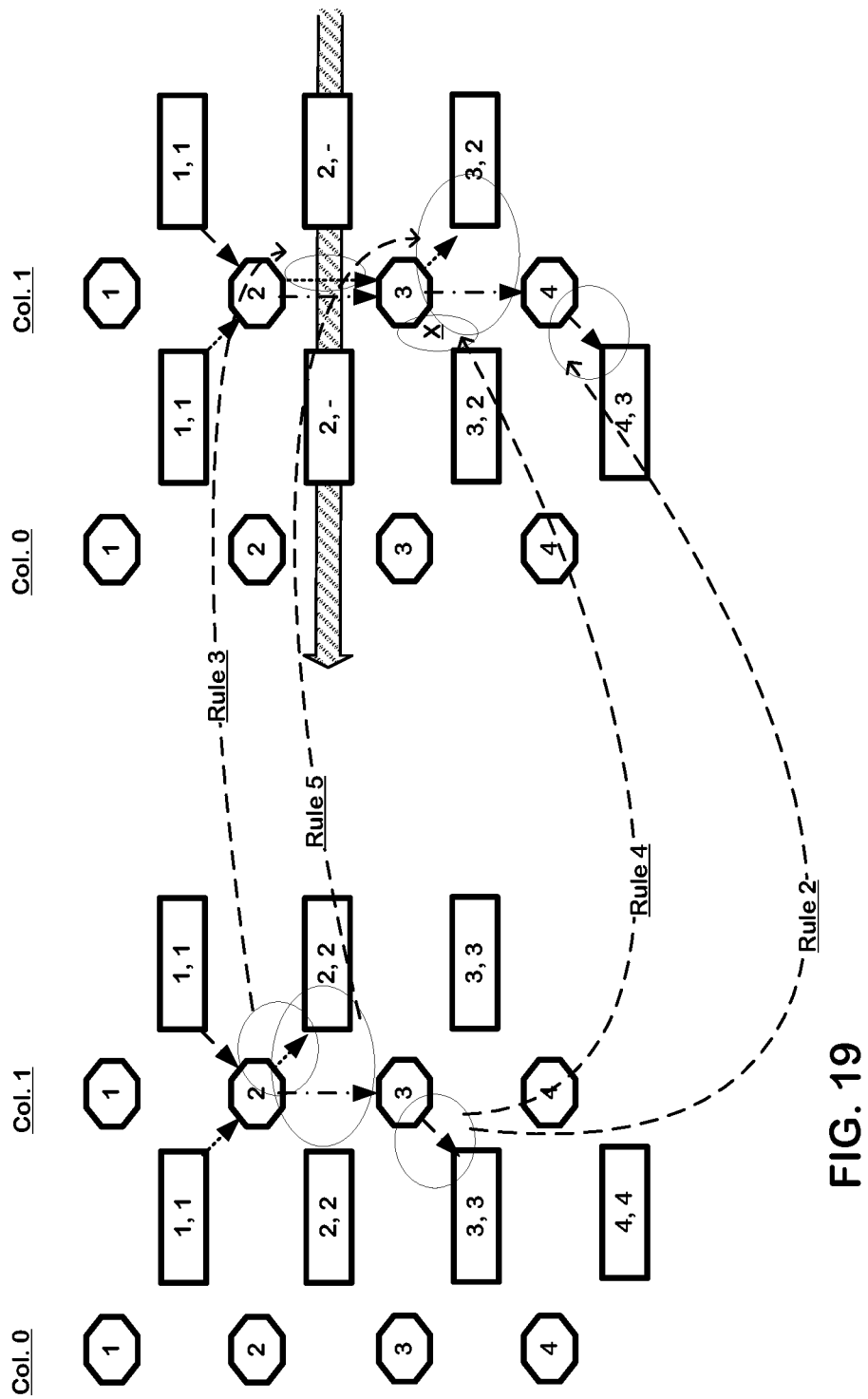
FIG. 19 illustrates another example of defect aware adjustment of flow routing.
Figure 20:
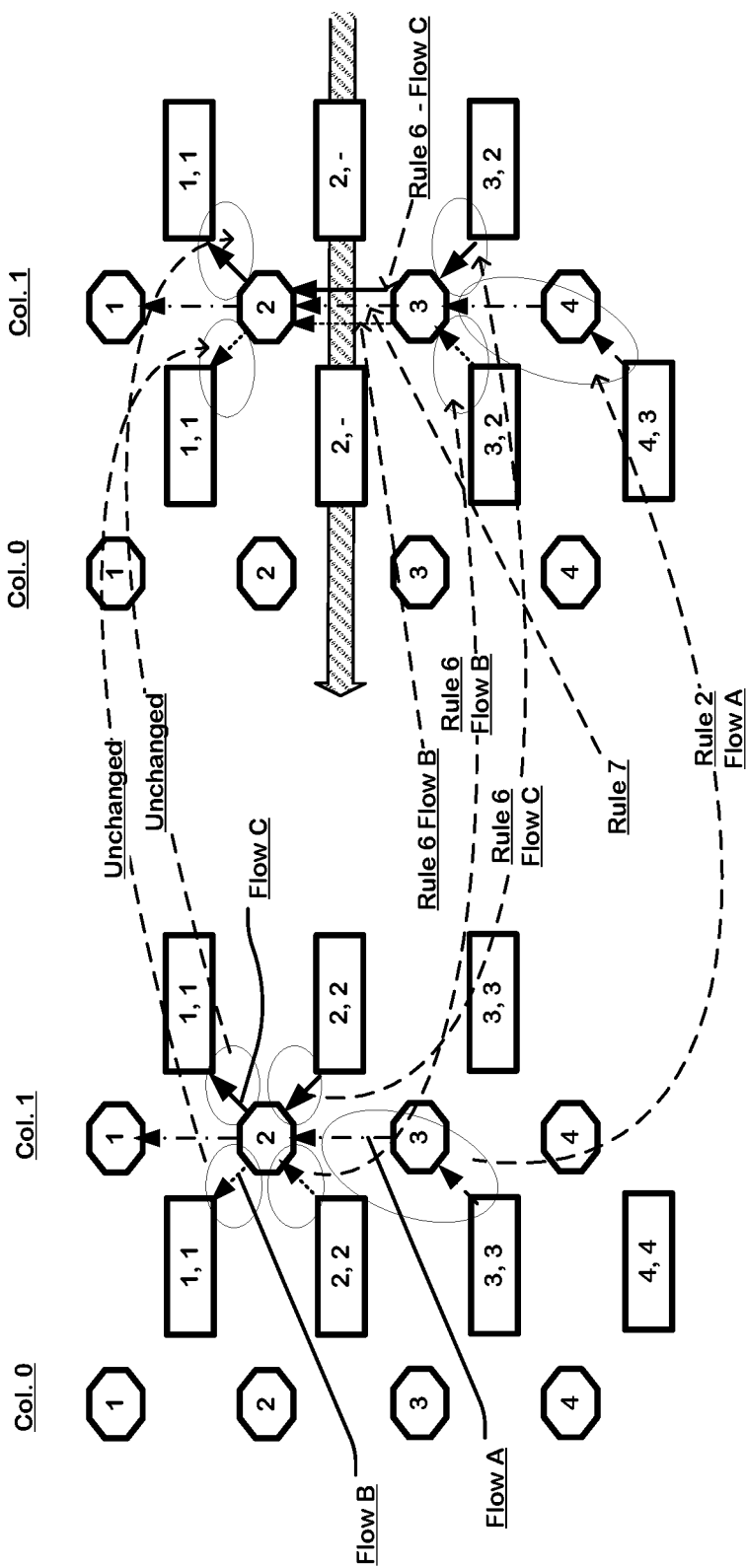
FIG. 20 illustrates yet another example of defect aware adjustment of flow routing.

Another protocol which can be used by the configurable interconnect, alone or in combination with dimension-order routing, is flow routing. The flow routing protocol can also be adjusted in response to the repair control signals identifying a bad row of functional configurable units in embodiments that utilize flow routing. FIGS. 18-20 illustrate rules implemented by logic circuits in the switches (or other interconnect configurable units) in order to preserve flow routing from an initial bit file among the functional configurable units.

In an embodiment configured as described herein, the updates of flow routing logic in dependence on the identification of the bad row can be generated by logic applying routing rules. A basic example of defect-aware flow routing rules, where physical row R is the bad row, and the switch row R is immediately above the bad row (SE and SW port connect to the bad row) includes the following:

Rule 1: No Changes if Switch physical Row Number<R.
Rule 2: If Switch physical Row Number>R+1, copy all Flow tables from switches on Switch Row Number−1.
Rule 3: On physical Row R Switches, any flows on N, E, W, NE, and NW inputs going SE or SW are replaced with S, preserve original S flows (only if their flow sources are N of R).
Rule 4: Disable original SE, SW, and S flows on all inputs on physical Row R+1 Switches.
Rule 5: Copy Southbound (S, SE, SW) flows and E and W flows from physical Row R to physical Row R+1 Switches.
Rule 6: Copy SE and SW input flows from Switch on physical Row R to Switch on physical Row R+1 and replace with N if and only if these flows are going North Bound in Switch on physical Row R.
Rule 7: Preserve N Flows on physical Row R+1 Switch, disable NE and NW outputs.

In FIGS. 18-20, switches are represented by octagons with numerals corresponding to the physical row of the switch. The functional configurable units are represented by rectangles having the physical row and virtual row numbers inside the rectangles. In the first column of switches, the upper virtual row and lower virtual row of the switches are identified by the parenthetical labels on the northeast side of the switches.

The upper portion of FIG. 18 illustrates a portion of the array with a flow as defined in an initial configuration file assuming no bad row. The flow is represented by the arrows going into and out of the sides of the switches and the corners of the functional configurable units. In the lower portion of FIG. 18, it is assumed that physical row 1 is a bad row R, and rules 1, 2 and 4-5 above are applied.

According to rule 1, there is no change to the configuration of the switches in switch row zero (R−1). According to rule 2, the flow tables for the upper and lower virtual device configurations from switch row 2 are copied to switch row 3 (>R+1). Rule 3 does not apply to this example flow. Rules 4 and 5 result in copying the S, SE and SW flows from the switch row 1 to switch row 2.

FIG. 19 illustrates another example, applying rules 2, 3, 4, and 5. In the left portion of FIG. 19, a flow is illustrated according to an initial configuration assuming no bad row. In the right portion of FIG. 19, it is assumed that physical row 2 is a bad row (i.e. R=2). According to rule 2, the southwest flow from the switch in switch row 3 is copied to the southwest flow in the switch in switch row 4 (i.e. row>R+1). According to rule 3, the Southeast flow on switch row R from the initial configuration is replaced with a South flow. According to rule 4, the southwest flow from switch row 3 (i.e. R+1) is blocked. According to rule 5, the South and Southeast flows from the switch in row 2 are copied to the switch in row 3.

FIG. 20 illustrates an example of the application of rules 6 and 7. On the left portion of FIG. 20, three flows labeled Flow A, Flow B, and Flow C are illustrated. Flow A is received on the Southwest port of the switch at row 3, is passed out of its North port to the South port of the switch at row 2, and is passed out of its North port to the South port of the switch at row 1. Flow B is received at the Southwest port of the switch at row 2, and passed out of its Northwest port. Flow C, is received at the South East port of the switch at row 2, and passed out of its North East port. In the right portion of FIG. 20, it is assumed that the functional configurable unit row 2 is the bad row (i.e., R=2). With regard to Flow A, rule 2, the Southwest input and North output for the switch at row 3 are copied to the Southwest port and North port on the switch at row 4. According to rule 7, the North output of Flow A on the switch at row 3 is preserved.

With regard to Flow B, the Northwest output of the switch at row 2 is unchanged. The Southwest input of the switch at row 2 in Flow B is moved according to rule 6 to the Southwest input of the switch at row 3, and replaced with a North flow from the switch at row 3 to the switch at row 2.

With regard to Flow C, the Northeast output of the switch at row 2 is unchanged. The Southeast input of the switch at row 2 in Flow B is moved according to rule 6 to the Southeast input of the switch at row 3, and replaced with a north flow from the switch at row 3 to the switch at row 2.

Examples of interconnect protocols updated in dependence on tagged unusable elements in an array of configurable units are described, referring to dimension-order routing and flow table routing protocols. Other routing protocols can be used.

Technologies are provided herein for repair of defective or otherwise unusable elements in CGRAs and similar systems.

By way of example, a system can comprise a tile consisting of 32 rows of functional configurable units (processing elements like PCUs and PMUs) and interconnect configurable units (Switches). A manufacturing defect on any one of the rows renders the tile unusable. Based on the defect density characteristics, there is a high probability that a defect exists on only one of the 32 rows of a tile. A substantial improvement in tile yield can be achieved by specifying one of the 32 rows as a spare row, and using it to achieve fault-free functionality of the tile in presence of any one unusable row. Circuitry and methods are described to reconfigure the processing elements and switches of a tile based on the failure mechanism of each individual tile. Through this reconfiguration, a fault-free performance can be achieved without requiring a re-compilation of the initial configuration file in some examples, or with limited re-compilation suitable for just-in-time adjustments of the configuration file in other examples, to be run on the tile.

Reconfiguration, in dependence on a tagged row, can consist of following:

- All functional configurable units on an unusable row are forced to be in RESET state and do not generate any outputs.
- All functional configurable units on remaining good rows and the spare row are reconfigured by AGCU to achieve the same computational and storage functionality as the originally programmed tile with 31 fault-free rows.
- All dimension-order packets from one component to another are rerouted by the Switches to achieve the same functionality on the newly configured tile as the originally programmed tile.
- All flow tables in all Switches are reprogrammed to ensure that packets routed using flow tables are routed to appropriate destinations.
- All circuit-switched control network routes are reconfigured to ensure correct operation of reconfigured tile components.
- The CSR ring implementation is modified so that it stays functional in the presence of an unusable row and ensures CSR commands and data are communicated to the reconfigured tile components.
- The Program command bus and Program-Done daisy chain implementation is modified to stay functional in the presence of an unusable row.
- All Edge Switches which handle communication between adjacent tiles are modified so that the reconfiguration of the tile is transparent to the adjacent tile.
- Program load/Program Unload/Argument load/Checkpoint/Restore functionality continues to be operational in a transparent manner.

Also described herein is a system, comprising a spatially reconfigurable array of processors, a statically configurable bus system connected to the processors in the spatially reconfigurable array, a parameter store storing data indicating an unusable processor in the spatially reconfigurable array, and logic to configure the statically configurable bus system in dependence on the data in the parameter store to route data around the unusable processor.

Also described herein is a system comprising a spatially reconfigurable array of processors, a controller coupled to the spatially reconfigurable array of processors, a parameter store storing data indicating an unusable processor in a spatially reconfigurable array, a control signal path arranged in a daisy chain from the controller through processors in the spatially reconfigurable array, and logic circuits to configure the control signal path to bypass the unusable processor in dependence on the data in the parameter store.

A system is described comprising an array of processors, the processors in the array having array locations, the array of processors configurable to implement a data processing operation; a bus system connected to the processors in the array, the bus system including configurable logic to route packets of data among the processors in the array; a parameter store storing data indicating a tagged subset of the array of processors, the tagged subset having at least one member; and a configuration controller to apply control signals to the configurable logic of the bus system in dependence on the tagged to subset.

An integrated circuit is described comprising a spatially reconfigurable array of processors on an integrated circuit substrate; a parameter store on the integrated circuit substrate storing data indicating a tagged processor in the array; and configuration logic circuits on the integrated circuit substrate to implement of placement configuration data in processors of the spatially reconfigurable array of processors to implement a data processing operation in dependence on the tagged processor. In some embodiments, the parameter store is not on the integrated circuit substrate, but can be located in any memory accessible by a component of the array.

An integrated circuit is described which comprises an array of configurable units on an integrated circuit substrate, the array including functional configurable units and interconnect configurable units (e.g. switches) configurable by configuration data to implement a data processing operation; a parameter store on the integrated circuit substrate storing data indicating a tagged functional configurable unit in the array; and configuration logic circuits on the integrated circuit substrate to generate repair control signals to configure the interconnect configurable units in dependence on the tagged functional configurable unit. The repair control signals can be applied using direct links, such as global wires to each of the interconnect configurable units in the array.

A method for operating a system is described, comprising a spatially reconfigurable array of processors, the processors in the array of processors having physical coordinates in the array and a configurable bus system connected to the processors in the array of processors, the method comprising accessing a parameter store storing data indicating a unusable processor in the array; assigning virtual coordinates to the processors in the store which applies control signals to switches in the configurable bus system.

A configuration controller is described to execute a procedure to load configuration data to the spatially reconfigurable array of processors to implement an executable graph using a subset of the array, excluding the unusable processor, in dependence on the data in the parameter store; and to configure the configurable bus system to route data among the processors in the array using the virtual coordinates.

A system is described including a spatially reconfigurable array of processors, the array of processors including a set of homogeneous sub-arrays of processors, the set including N+1 members; a statically configurable bus system connected to the processors in the set of homogeneous sub-arrays of processors; a parameter store storing data indicating a unusable homogeneous sub-array of the set of homogeneous sub-arrays; and a runtime processor and memory accessible to the runtime processor storing a host program executable to load configuration data for an executable graph in the spatially reconfigurable array of processors, to configure the spatially reconfigurable array of processors and the statically configurable bus system in response to the indicated unusable homogeneous sub-array.

The statically configurable bus system can include an array of switches having flow tables, and the configuration data includes the flow tables for the executable graph; and including logic responsive to the indicated unusable sub-array to modify the flow tables.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A switch for use in routing data in an array of Functional Configurable Units (FCUs) having homogeneous subarrays of FCUs identified by an index, the switch comprising:
   an indicator of a index number of the switch;
   an input of a tagged index number of a subarray of FCUs to bypass;
   a plurality of input ports;
   a plurality of output ports; and
   routing logic that selects an output port of the plurality of output ports based, at least in part, on the indicator of the index number of the switch and the tagged index number to bypass, and routes data received on an input port of the plurality of input ports to the selected output port.

2. The switch of claim 1, wherein the homogeneous subarrays of FCUs comprise columns of FCUs in the array of FCUs and the index comprises a column number.

3. The switch of claim 1, wherein the homogeneous subarrays of FCUs comprise rows of FCUs in the array of FCUs and the index comprises a row number.

4. The switch of claim 1, wherein the indicator of the index number of the switch provides a physical index number; and
   the switch further comprising a virtual index register that is set to the physical index number of the switch in response to the physical index number being less than the tagged index number, and is set to one less than the physical index number of the switch in response to the physical index number being greater than the tagged index number, and is set to indicate an unused index in response to the physical index number being equal to the tagged index number;
   wherein the routing logic uses the virtual index register to select the output port.

5. The switch of claim 4, wherein the virtual index register for the switch is a first virtual index register; and
   the switch further comprising a second virtual index register that is set to one less than the physical index number of the switch in response to the physical index number being less than or equal to the tagged index number, and is set to two less than the physical index number of the switch in response to the physical index number being at least two greater than the tagged index number, and is set to indicate an unused index in response to the physical index number being one more than the tagged index number;
   wherein the routing logic also uses the second virtual index register to select the output port.

6. The switch of claim 5, the data received on the input port addressed to an FCU in a target subarray identified by a target index; and
   the routing logic further using the target index to select the output port by selecting a first output port of the plurality of output ports in response to the target index being less than the second virtual index register, selecting a second output port of the plurality of output ports in response to the target index being greater than the first virtual index register.

7. The switch of claim 6, the routing logic further using the target index to select the output port by selecting a third output port of the plurality of output ports in response to the target index being equal to the second virtual index register.

8. The switch of claim 6, the routing logic further using the target index to select the output port by selecting a third output port of the plurality of output ports in response to the target index being equal to the first virtual index register.

9. The switch of claim 1, further comprising:
   a first repair control input that selectively blocks routing the data received for input ports in a first subset of input ports of the plurality of input ports, wherein the first subset of input ports are respectively coupled to FCUs of a first subarray of FCUs in the array of FCUs; and
   a second repair control input that selectively blocks routing the data received for input ports in a second subset of input ports of the plurality of input ports, wherein the second subset of input ports are respectively coupled to FCUs of a second subarray of FCUs in the array of FCUs.

10. The switch of claim 9, wherein the first subarray of FCUs has an index number equal to the index number of the switch, and the second subarray of FCUs has an index number that differs from the index number of the switch by one.

11. A method for routing data in an array of Functional Configurable Units (FCUs) having homogeneous subarrays of FCUs identified by an index, the method comprising:
    obtaining an indicator of an index number of a switch coupled to a plurality of FCUs in the array of FCUs, the switch having a plurality of input ports and a plurality of output ports;
    obtaining a tagged index number of a subarray of FCUs to bypass;
    receiving data on an input port of the plurality of input ports addressed to a FCU in a target subarray identified by a target index;
    selecting, by routing logic in the switch, an output port of the plurality of output ports based, at least in part, on the target index, the indicator of the index number of the switch, and the tagged index number to bypass; and
    routing the data to the selected output port.

12. The method of claim 11, wherein the homogeneous subarrays of FCUs comprise columns of FCUs in the array of FCUs and the index comprises a column number.

13. The method of claim 11, wherein the homogeneous subarrays of FCUs comprise rows of FCUs in the array of FCUs and the index comprises a row number.

14. The method of claim 11, wherein the indicator of the index number of the switch provides a physical index number, the method further comprising:
    setting a virtual index register of the switch to:
       the physical index number of the switch in response to the physical index number being less than the tagged index number,
       one less than the physical index number of the switch in response to the physical index number being greater than the tagged index number, and
       a value to indicate an unused index in response to the physical index number being equal to the tagged index number; and
    using the virtual index register to select the output port.

15. The method of claim 14, wherein the virtual index register for the switch is a first virtual index register; the method further comprising:
    setting a second virtual index register of the switch to:
       one less than the physical index number of the switch in response to the physical index number being less than or equal to the tagged index number, two less than the physical index number of the switch in response to the physical index number being at least two greater than the tagged index number, and the value to indicate an unused index in response to the physical index number being one more than the tagged index number; and using the second virtual index register to select the output port.

16. The method of claim 15, further comprising:

selecting a first output port of the plurality of output ports in response to the target index being less than the second virtual index register; and selecting a second output port of the plurality of output ports in response to the target index being greater than the first virtual index register.

17. The method of claim 16, further comprising selecting a third output port of the plurality of output ports in response to the target index being equal to the second virtual index register.

18. The method of claim 16, further comprising selecting a third output port of the plurality of output ports in response to the target index being equal to the first virtual index register.

19. The method of claim 11, further comprising:

selectively blocking the routing of the data received for input ports in a first subset of input ports of the plurality of input ports based on a first repair control signal, wherein the first subset of input ports are respectively coupled to FCUs of a first subarray of FCUs in the array of FCUs; and selectively blocking the routing of the data received for input ports in a second subset of input ports of the plurality of input ports based on a second repair control signal, wherein the second subset of input ports are respectively coupled to FCUs of a second subarray of FCUs in the array of FCUs.

20. The method of claim 19, wherein the first subarray of FCUs has an index number equal to the index number of the switch, and the second subarray of FCUs has an index number that differs from the index number of the switch by one.

* * * * *